(12) United States Patent
Chen et al.

(10) Patent No.: US 12,087,837 B2
(45) Date of Patent: Sep. 10, 2024

(54) SEMICONDUCTOR DEVICE WITH BACKSIDE CONTACT AND METHODS OF FORMING SUCH

(71) Applicant: Taiwan Semiconductor Manufacturing Company, Ltd., Hsin-Chu (TW)

(72) Inventors: Ting-Yeh Chen, Hsinchu (TW); Yen-Ting Chen, Taichung (TW); Wei-Yang Lee, Taipei (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 438 days.

(21) Appl. No.: 17/375,264

(22) Filed: Jul. 14, 2021

(65) Prior Publication Data

US 2022/0285510 A1 Sep. 8, 2022

Related U.S. Application Data

(60) Provisional application No. 63/157,023, filed on Mar. 5, 2021.

(51) Int. Cl.
*H01L 29/423* (2006.01)
*H01L 21/8234* (2006.01)
*H01L 29/06* (2006.01)
*H01L 29/66* (2006.01)
*H01L 29/786* (2006.01)

(52) U.S. Cl.
CPC ............... *H01L 29/42392* (2013.01); *H01L 21/823418* (2013.01); *H01L 29/0649* (2013.01); *H01L 29/0665* (2013.01); *H01L 29/66545* (2013.01); *H01L 29/78696* (2013.01)

(58) Field of Classification Search
CPC .......... H01L 29/42392; H01L 29/0649; H01L 29/0665; H01L 29/66545; H01L 29/78696; H01L 29/1079; H01L 21/823418; H01L 21/823842; H01L 21/823871;
(Continued)

(56) References Cited

U.S. PATENT DOCUMENTS 8,836,016 B2 9/2014 Wu et al.
8,841,701 B2 9/2014 Lin et al.
(Continued)

*Primary Examiner* — Dao H Nguyen
(74) *Attorney, Agent, or Firm* — HAYNES AND BOONE, LLP

(57) ABSTRACT

In an exemplary aspect, the present disclosure is directed to a device. The device includes a fin-shaped structure extending lengthwise along a first direction. The fin-shaped structure includes a stack of semiconductor layers arranged one over another along a second direction perpendicular to the first direction. The device also includes a first source/drain feature of a first dopant type on the fin-shaped structure and spaced away from the stack of semiconductor layers. The device further includes a second source/drain feature of a second dopant type on the fin-shaped structure over the first source/drain feature along the second direction and connected to the stack of semiconductor layers. The second dopant type is different from the first dopant type. Furthermore, the device additionally includes an isolation feature interposing between the first source/drain feature and the second source/drain features.

20 Claims, 21 Drawing Sheets

(58) Field of Classification Search
CPC ......... H01L 21/823878; H01L 21/8221; H01L 27/0688; H01L 27/0922; H01L 27/0924
See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 11,069,684 B1* | 7/2021 | Xie | H01L 21/823871 |
| 11,164,792 B2* | 11/2021 | Xie | H01L 21/02603 |
| 2020/0105751 A1* | 4/2020 | Dewey | H01L 21/8256 |
| 2020/0294998 A1* | 9/2020 | Lilak | H01L 23/53295 |
| 2021/0408257 A1* | 12/2021 | Thomas | H01L 21/8221 |

\* cited by examiner

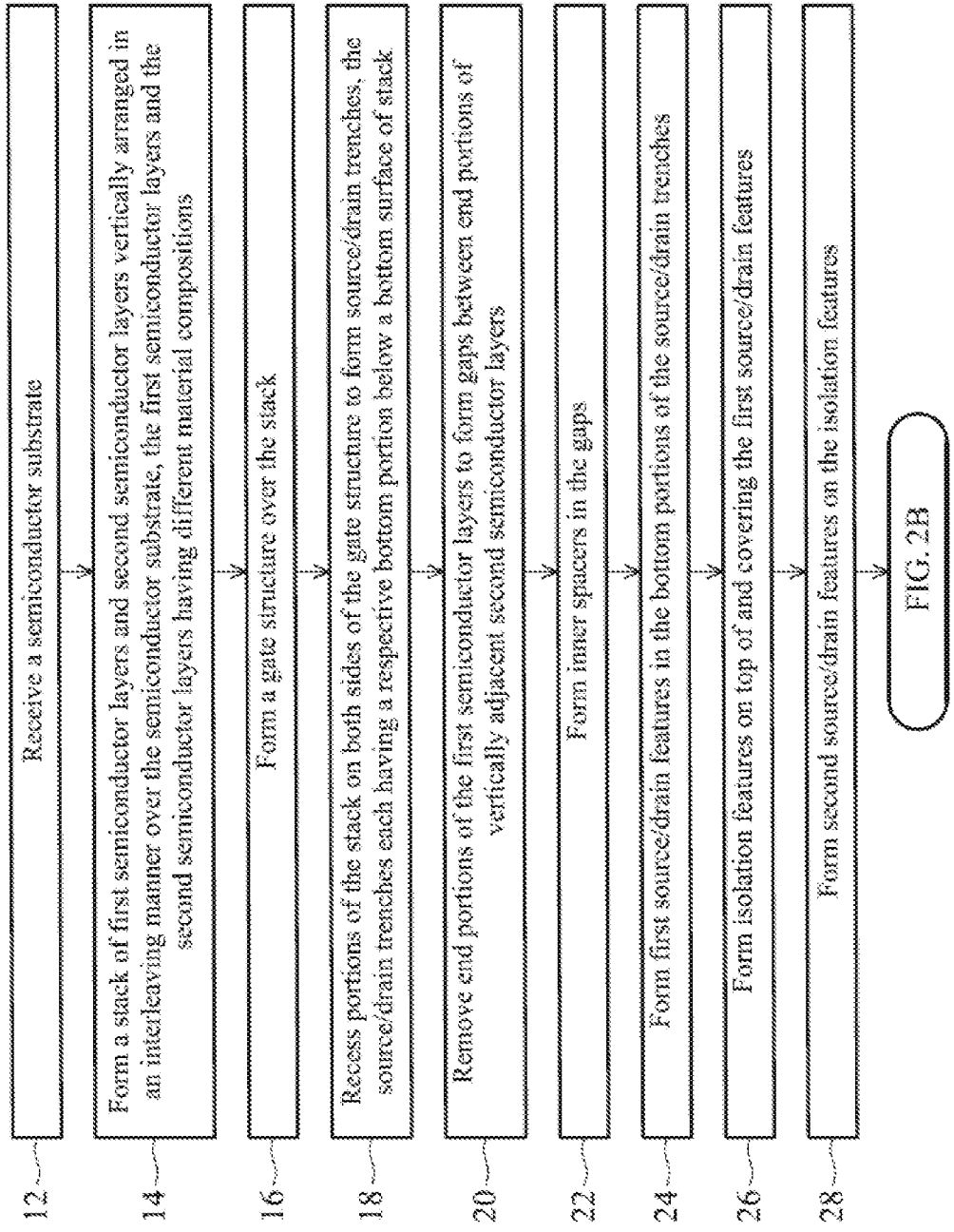

SEMICONDUCTOR DEVICE WITH BACKSIDE CONTACT AND METHODS OF FORMING SUCH

PRIORITY DATA

This application claims priority to U.S. Provisional Patent Application No. 63/157,023, filed on Mar. 5, 2021, entitled "Semiconductor Device with Backside Contact and Methods of Forming Such", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is nano-sheet-based transistor, whose gate structure extends around its channel region providing access to the channel region on all sides. The nano-sheet-based transistors are compatible with conventional metal-oxide-semiconductor (MOS) processes, allowing them to be aggressively scaled down while maintaining gate control and mitigating SCEs. However, as consumer demands for further enhanced device performances continue to grow at rapid paces, further reducing chip footprints of the transistors from what conventional nano-sheet-based transistor configurations can offer has become more and more desirable. Therefore, although conventional nano-sheet-based transistors have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B are flow charts of an example method for fabricating an embodiment of a nanosheet-based device of the present disclosure according to some embodiments of the present disclosure.

DETAILED DESCRIPTION

Figure 1B:
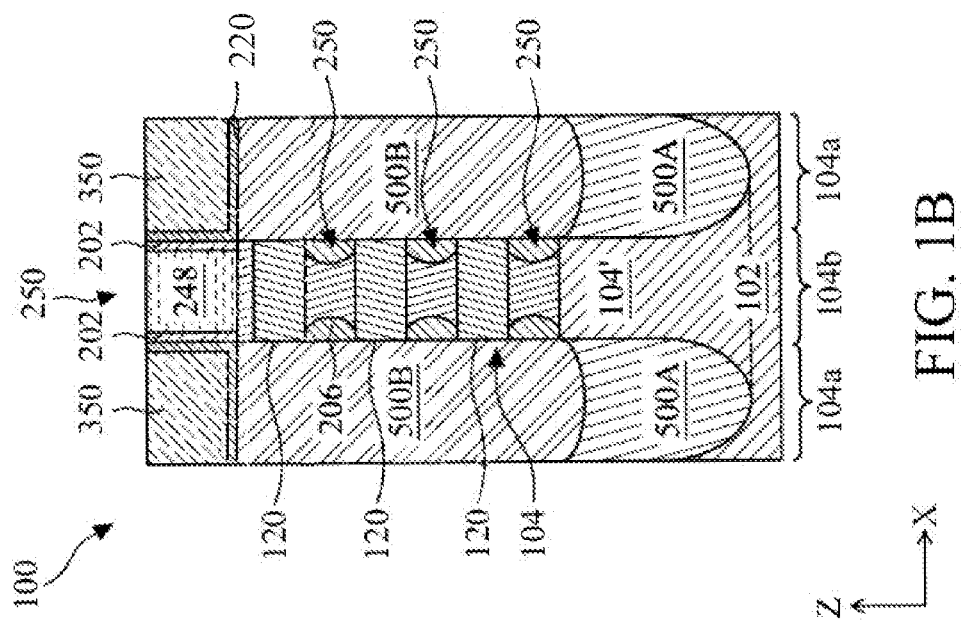
FIG. 1B is a cross-sectional view of an embodiment of a nanosheet-based device of the present disclosure along the line A-A' in FIG. 1A constructed according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" may encompass the dimension range from 4.5 nm to 5.5 nm.

The present disclosure is generally related to ICs and semiconductor devices and methods of forming the same. More particularly, the present disclosure is related to complementary metal-oxide-semiconductor (CMOS) device. CMOS is a type of semiconductor device that uses a combination of p-type transistors (PMOS) and n-type transistors (NMOS) to implement logic gates and other circuits. CMOS technology is used for constructing microprocessors, memory chips, microcontrollers, among others. As technologies progress towards smaller technology nodes (for example, 20 nm, 16 nm, 10 nm, 7 nm, 5 nm, and below), the optimization of CMOS performance increasingly hinges on reducing its chip footprint and increase the packing density. As a result, nano-sheet-based transistors have become a popular and promising architecture for building CMOS devices. Nanosheet-based transistors are sometimes referred to as gate-all-around (GAA) transistors, multi-bridge-channel (MBC) transistors, or some other names. Generally, a nanosheet-based transistor includes a plurality of suspended channel layers (or simply "channel layers") stacked one on top of another and engaged by a gate structure. The channel layers of a nanosheet-based transistor may include any suitable shapes and/or configurations. For example, the channel layers may be in one of many different shapes, such as wire (or nanowire), sheet (or nanosheet), bar (or nano-bar), and/or other suitable shapes. In other words, the term nanosheet-based transistors broadly encompasses transistors having channel layers in nanowire, nano-bars, and any other suitable shapes. Further, the channel layers of the nanosheet-based transistors may engage with a single, contiguous gate structure, or multiple gate structures. The channel layers engage with a gate structure that includes portions between vertically adjacent channel layers. Inner spacers are formed between the source/drain features and the respective gate structure such that proper electrical isolation is maintained. A pair of epitaxial source/drain features (interchangeably referred to as epitaxial features or source/drain features) are formed on both ends of the channel layers, such that the charge carriers may flow from the source region to the drain region through the channel layers during the operation (such as when the transistors are turned on).

In many approaches, CMOS based on nano-sheet-based transistors arrange the PMOS and NMOS side-by-side on the substrate. Accordingly, the CMOS may have a chip footprint that is at least twice that of a conventional nano-sheet-based transistor. As consumer demands for further enhanced device performances continue to grow at rapid paces, such configurations have been increasingly approaching the size limit they can offer. Demand for further miniaturized transistor configurations have become ever more urgent. The present disclosure provides methods of fabricating nano-sheet-based CMOS devices with the PMOS and NMOS transistors vertically stacked on the substrate. In other words, the PMOS and NMOS are formed vertically aligned with each other, and on two separate planes that are each parallel to the top surface of the semiconductor substrate. Accordingly, the chip footprint of the CMOS is further reduced as compared to other approaches. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from some aspects of the present disclosure.

Figure 1A:
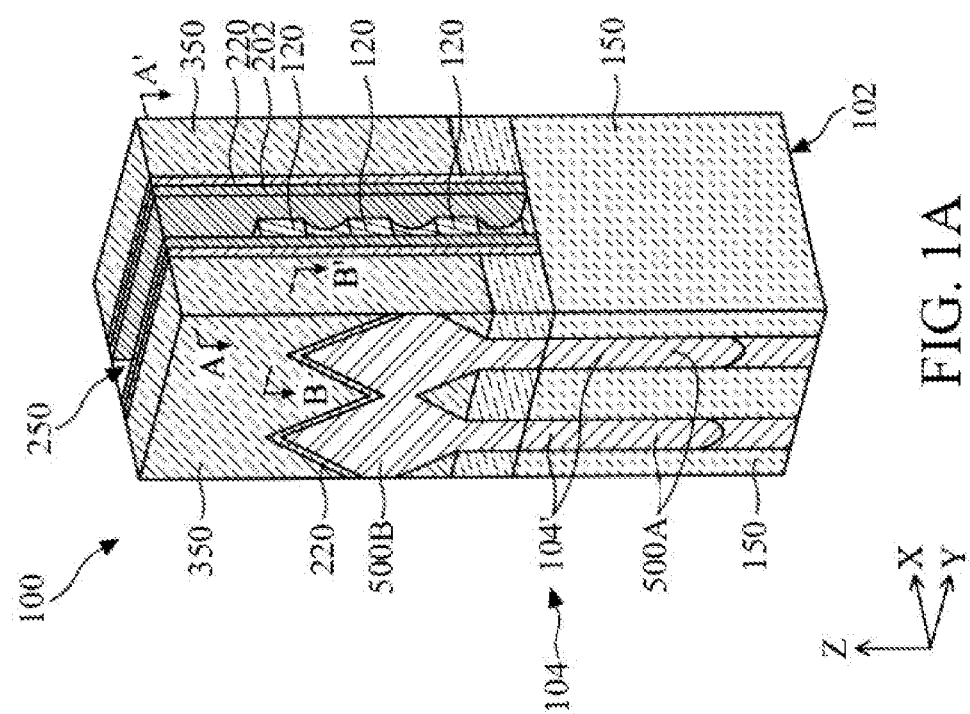
FIG. 1A is a three-dimensional (3D) perspective view of an embodiment of a nanosheet-based device of the present disclosure constructed according to some embodiments of the present disclosure.

An example CMOS device 100 based on nanosheet-based transistors (or simply device 100) is illustrated in FIGS. 1A and 1B. FIG. 1A is a three-dimensional (3D) perspective view of an embodiment of device 100 according to embodiments of the present disclosure. FIG. 1B is a cross-sectional view of the device 100 of FIG. 1A along the line A-A'. FIGS. 1A and 1B are provided for better visualization and understanding of features subsequently described in cross-sectional views. FIGS. 1A and 1B have been abbreviated and may not include all features described in detail later. As illustrated, the device 100 includes a semiconductor substrate (or substrate) 102. Fin structures (or fins) 104 are formed over the substrate 102, each extending lengthwise horizontally in an X-direction and separated from each other horizontally in a Y-direction. The X-direction and the Y-direction are perpendicular to each other, and the Z-direction is orthogonal (or normal) to a horizontal XY plane defined by the X-direction and the Y-direction. The substrate 102 may have its top surface parallel to the XY plane.

The fin structures 104 each have a source region 104a and a drain region 104a disposed along the X-direction. The source region 104a and the drain region 104a are collectively referred to as the source/drain regions 104a. Epitaxial source/drain features 500A and 500B are formed in or on the source/drain regions 104a of the fin structure 104. In some embodiments, the epitaxial source/drain features 500A and/or 500B may merge together, for example, along the Y-direction between adjacent fin structures 104 to provide a larger lateral width than an individual epitaxial source/drain feature. The fin structures 104 each further have a channel region 104b disposed between and connecting the source/drain regions 104a. The fin structures 104 each include a base fin 104' in the channel region 104b of the fin structures 104 and a stack of suspended semiconductor layers 120 (also interchangeably referred to as "semiconductor layers 120," "suspended channel layers 120," "channel layers 120," "channels 120," or "higher channels 120") vertically (e.g. along the Z-direction) above the base fin 104' extending upwards from the substrate 102. The base fin 104' connects a pair of epitaxial source/drain features 500A. Each of the suspended semiconductor layers 120 connects a pair of epitaxial source/drain features 500B. The suspended semiconductor layers 120 may each be in one of many different shapes, such as wire (or nanowire), sheet (or nanosheet), bar (or nano-bar), and/or other suitable shapes, and may be spaced away from each other. In the depicted embodiments, there are three semiconductor layers 120 in the stack. However, there may be any appropriate number of layers in the stack, such as 2 to 10 layers. The semiconductor layers 120 may each engage with a single, contiguous gate structure 250. Inner spacer features 206 are formed between the gate structure 250 and the source/drain features 500B to provide protection and ensure proper isolation. Note that the gate structure 250 is illustrated as a transparent feature in FIG. 1A in order to illustrate the features (such as the semiconductor layers 120) that the gate structure 250 covers. FIGS. 1A and 1B have been abbreviated to provide a general picture of the device 100, and do not include all details. These details, along with additional details are described in conjunction with subsequent figures.

The device 100 further includes isolation features 150 within or over the substrate 102, separating adjacent fin structures 104 from each other. The isolation features 150 may be shallow trench isolation (STI) features. In some examples, the formation of the isolation features 150 includes etching trenches into the substrate 102 between the active regions (the regions in which the fin structures are formed) and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 150. The isolation features 150 may have a multi-layer structure such as a thermal oxide liner layer over the substrate 102 and a filling layer (e.g., silicon nitride or silicon oxide) over the thermal oxide liner layer. Alternatively, the isolation features 150 may be formed using any other isolation technologies. As illustrated in FIG. 1A, the stacks of semiconductor layers 120 are each located above the top surface of the isolation features 150. In the depicted embodiment, the device 100 further includes gate spacer layers 202 on both sides of the gate structures 250; contact etch stop layers 220 over the epitaxial source/drain features 500B; and interlayer dielectric (ILD) layer 350 over the epitaxial source/drain features 500B and over the contact etch stop layers 220.

Figure 2B:
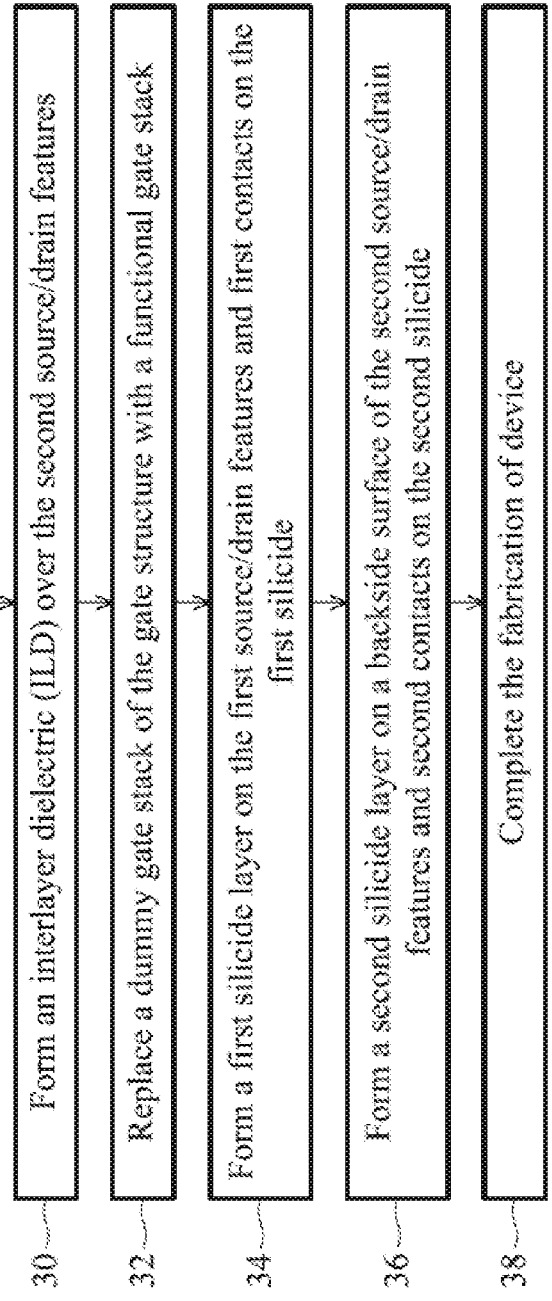

FIGS. 2A-2B are flow charts illustrating an example method 10 for fabricating a device 100 of the present disclosure according to some embodiments of the present disclosure. FIGS. 3-6, 7A-7C, 8, 9A, 9C, 10-13, and 14A are cross-sectional views of the device along the line A-A' in FIG. 1A constructed at various fabrication stages according to embodiments of the method 10. FIGS. 9B, 9D, and 14B are cross-sectional views of the device along the line B-B' in FIG. 1A constructed at various fabrication stages according to embodiments of the method 10.

Figure 3:
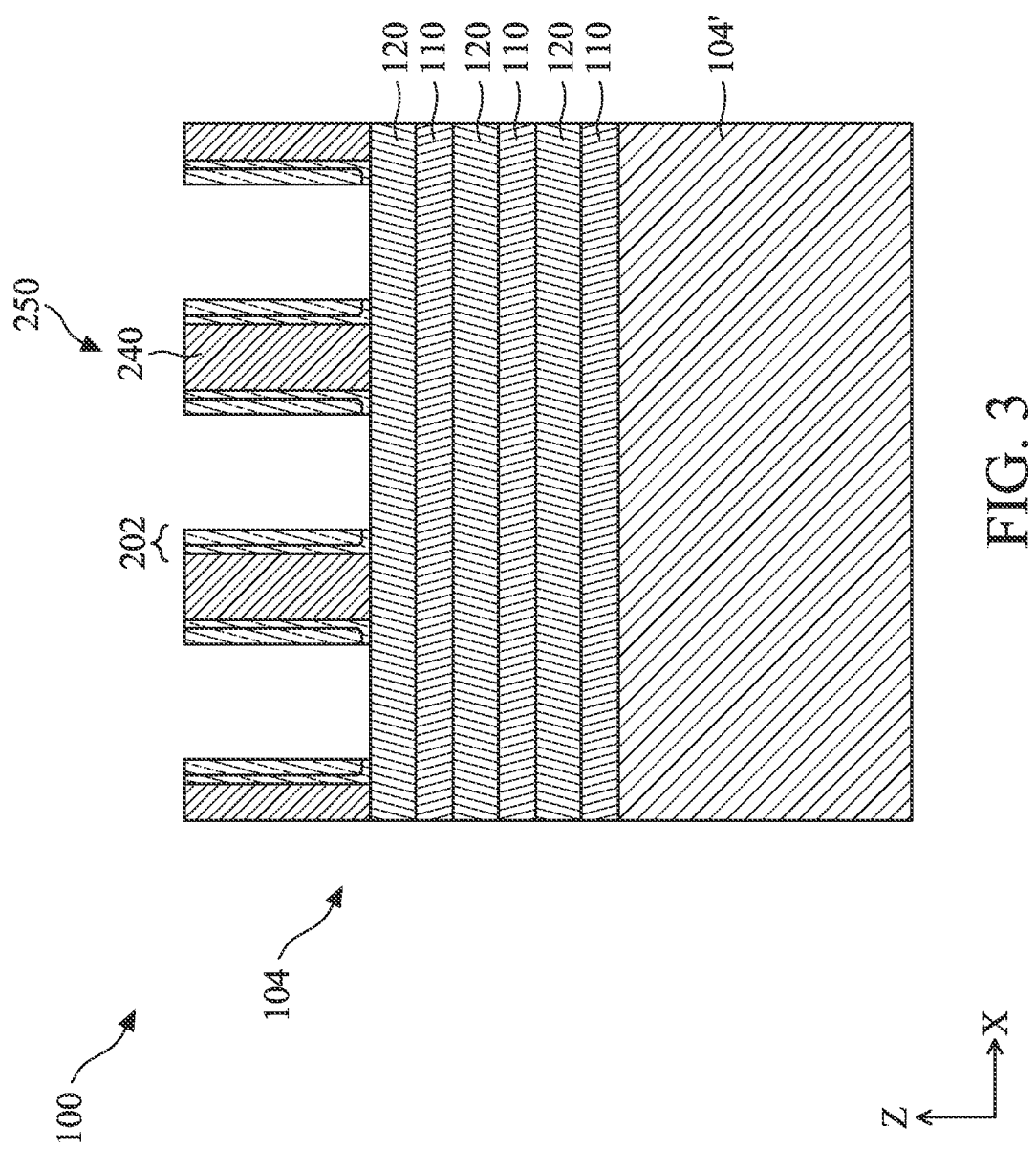
FIGS. 3, 4, 5, 6, 7A, 7B, 7C, 8, 9A, 9C, 10, 11, 12, 13, and 14A are cross-sectional views of embodiments of nanosheet-based devices of the present disclosure along the line A-A' in FIG. 1A constructed at various fabrication stages according to some embodiments of the present disclosure.

Referring to block 12 of FIG. 2A and FIG. 3, the device 100 includes a substrate 102. The substrate 102 contains a semiconductor material, such as bulk silicon (Si), germanium (Ge), silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 102 may also include a semiconductor-on-insulator substrate, such as Si-on-insulator (SOI), SiGe-on-insulator (SGOI), Ge-on-insulator (GOI) substrates. Descriptions below illustrate the fabrication of an NMOS device 100 as an example. The same or similar methods may be implemented for PMOS devices or CMOS devices.

Referring to block 14 of FIG. 2A and FIG. 3, a stack of semiconductor layers is formed over the substrate 102. The stack of semiconductor layers includes semiconductor layers 110 and semiconductor layers 120 alternating with each other. For example, a semiconductor layer 110 is formed over the substrate 102; a semiconductor layer 120 is formed over the semiconductor layer 110; and another semiconductor layer 110 is formed over the semiconductor layer 120, so on and so forth. The material compositions of the semiconductor layers 110 and 120 are configured such that they have an etching selectivity in a subsequent etching process. For example, in the depicted embodiments, the semiconductor layers 110 contain silicon germanium (SiGe), while the semiconductor layers 120 contain silicon (Si). In some other embodiments, the semiconductor layers 120 contain SiGe, while the semiconductor layers 110 contain Si. In yet other embodiments, the semiconductor layers 120 and 110 both contain SiGe, but have different Ge atomic concentrations. The semiconductor layers 110 may each have a same or different thickness from each other, and from thickness(es) of the semiconductor layers 120. In some embodiments, the semiconductor layers 110 and 120 may each have a thickness of about 5 nm to about 15 nm. If the thickness of the semiconductor layers 120 too small, the device resistance may be too high; if the thickness of the semiconductor layers 120 too large, gate control of certain portions of the transistor channel may not be sufficient. If the thickness of the semiconductors 110 too small, there may not sufficient spaces for the forming of gate layers; if the thickness of the semiconductor layers 110 too large, any benefit is offset by the increased material cost and reduced efficiency.

The stacks of semiconductor layers, as well as the portion of the substrate immediately below the stack of semiconductor layers, are patterned into a plurality of fin structures 104 such that they each extend along the X-direction. The bottom portions of the fin structures 104, those formed from the substrate 102, are referred as the base fins 104'. The fin structures 104 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The fin structures 104 may have lateral widths along the Y-direction that are the same between each other or different from each other.

Referring to block 16 of FIG. 2A and FIG. 3, gate structures 250 are formed over a portion of each of the fin structures 104. In some embodiments, the gate structures 250 are also formed over the isolation features 150 (see FIG. 1A) in between adjacent fin structures 104. The gate structures 250 may be configured to extend lengthwise parallel to each other, for example, each along the Y-direction. In some embodiments, the gate structures 250 each wrap around the top surface and side surfaces of each of the fin structures 104. The gate structures 250 may include a dummy gate stack 240. The dummy gate stack 240 includes a dummy gate dielectric layer, a dummy gate electrode layer, as well as one or more hard mask layers used to pattern the dummy gate electrode layer. In some embodiments, the dummy electrode layer includes polysilicon. The dummy gate stacks 240 may undergo a gate replacement process through subsequent processing to form functional gate stacks, such as a high-k metal gate, as discussed in greater detail below. The dummy gate stacks 240 may be formed by a procedure including deposition, lithography, patterning, and etching processes. The deposition processes may include CVD, ALD, PVD, other suitable methods, or combinations thereof.

Gate spacers 202 are formed on the sidewalls of the dummy gate stacks 240. In the depicted embodiment, a gate spacer layer 202 is formed over the top surface of the device. The gate spacer layers 202 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In some embodiments, the gate spacers 202 may include multiple sub-layers each having a different material. In some embodiments, the gate spacer layers 202 may have a thickness in the range of a few nanometers (nm). In some embodiments, the gate spacer layers 202 may be formed by depositing a spacer layer (containing the dielectric material) over the dummy gate stacks 240, followed by an anisotropic etching process to remove portions of the spacer layer from the top surfaces of the dummy gate stacks 240. After the etching process, portions of the spacer layer on the sidewall surfaces of the dummy gate stacks 240 substantially remain and become the gate spacer layers 202. In some embodiments, the anisotropic etching process is a dry (e.g. plasma) etching process. Additionally or alternatively, the formation of the gate spacer layers 202 may also involve chemical oxidation, thermal oxidation, ALD, CVD, and/or other suitable methods.

Figure 4:
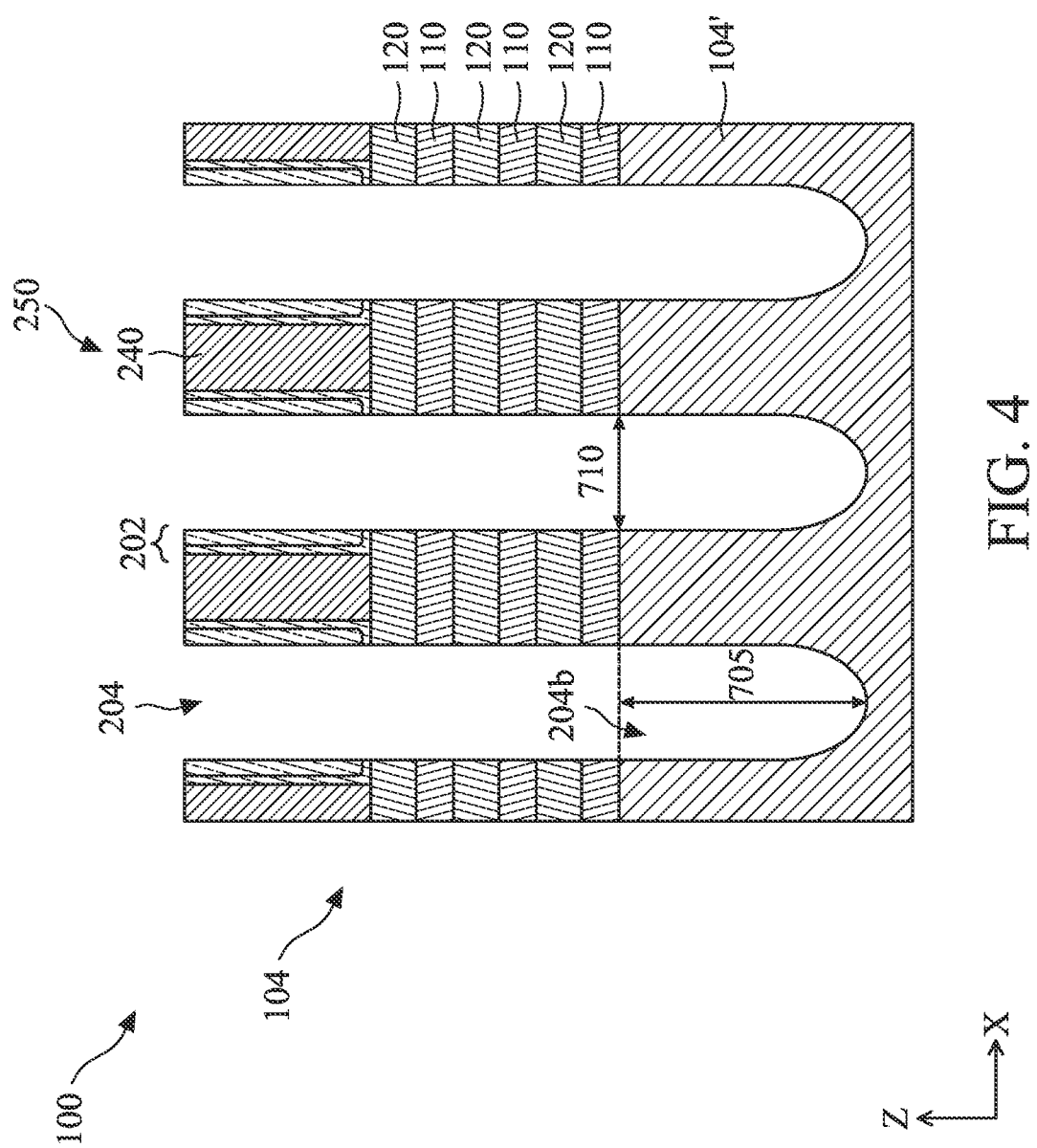

Referring to block 18 of FIG. 2A and FIG. 4, portions of the fin structure 104 adjacent to and exposed by the gate structures 250 (e.g., in the source/drain regions 104a, see FIGS. 1A and 1B) are at least partially recessed (or etched away) to form the source/drain trenches 204. Meanwhile, the portions of the fin structure 104 underneath the gate structures 250 remain intact. Additional mask elements (such as photoresists) may also be employed to protect areas not designed to be removed during the process. The recessing process removes not only the stack portions of fin structure 104, but also a portion of the base fins 104'. Accordingly, the source/drain trenches 204 extends below the top surface of the substrate 102 (which may also be the bottom surface of the stack of semiconductor layers 120 and 110). The bottom portion of the source/drain trenches 204 below the top surface of the substrate 102 (which may also be the bottom surface of the stack of semiconductor layers 120 and 110) are hereinafter referred to as trench portions 204b. The trench portions 204b are also below the lowest layer of subsequently formed channel layers. Accordingly, the trench portions 204b may be referred to as the "sub-channel" portion of the source/drain trench 204. The process may include multiple lithography and etching steps, and may use any suitable methods, such as dry etching and/or wet etching. In some embodiments, the trench portions 204b has a profile that resembles the "U" letter although the two prongs of the "U" may be curved, and the bottom of the "U" may be less rounded thereby more resembling a "V". However, the present disclosure contemplates trench portions 204b that have any suitable profiles. In some embodiments, the top surface of the trench portions 204b may have a width 710 along the X-direction. This dimension determines a lateral dimension of the subsequently formed source/drain features 500A. In some embodiments, the width 710 may be about 10 nm to about 30 nm. Moreover, the trench portions 204b may have a height dimension 705, measured from the bottom surface of the source/drain trench 204 and the bottom surface of the bottommost semiconductor layer 110. As described in detail later, the height dimension 705 determines the height dimension of subsequently formed source/drain features 500A. In some embodiments, the height dimension 705 may be about 10 nm to about 40 nm. If the width 710 is too small, such as less than about 10 nm, or if the height dimension 705 is too small, such as less than about 10 nm, the source/drain features 500A formed therein may not have sufficient volume to provide sufficient amount of charge carriers to function as designed. If the width 710 is too large, such as greater than about 30 nm, any benefit may be offset by the increase in the chip footprint and the loss of efficiency due to that. If the height dimension 705 is too large, such as greater than about 40 nm, the increased height does not offer benefits that are significant enough to justify its costs.

The formation of the source/drain trenches 204 exposes sidewalls of the stack of semiconductor layers 110 and 120. Referring to block 20 of FIG. 2B and FIG. 5, portions of the semiconductor layers 110 are removed through the exposed sidewall surfaces in the source/drain trenches 204 via a selective etching process. Because the selective etching process recesses the semiconductor layers 110 in a lateral direction along the X-direction, it may sometimes be referred to as a lateral etching process, or a lateral recessing process. The selective etching process is designed to remove end portions of the semiconductor layers 110 but only minimally (or not) affect the semiconductor layers 120. For example, two end portions of the semiconductor layers 110 may be removed to form respective openings 205, while the end portions of the semiconductor layers 120 directly above and below the removed end portions of the semiconductor layers 110 (hence above and below the openings 205) are substantially preserved. Therefore, openings 205 are formed between the vertically adjacent semiconductor layers 120.

Figure 5:
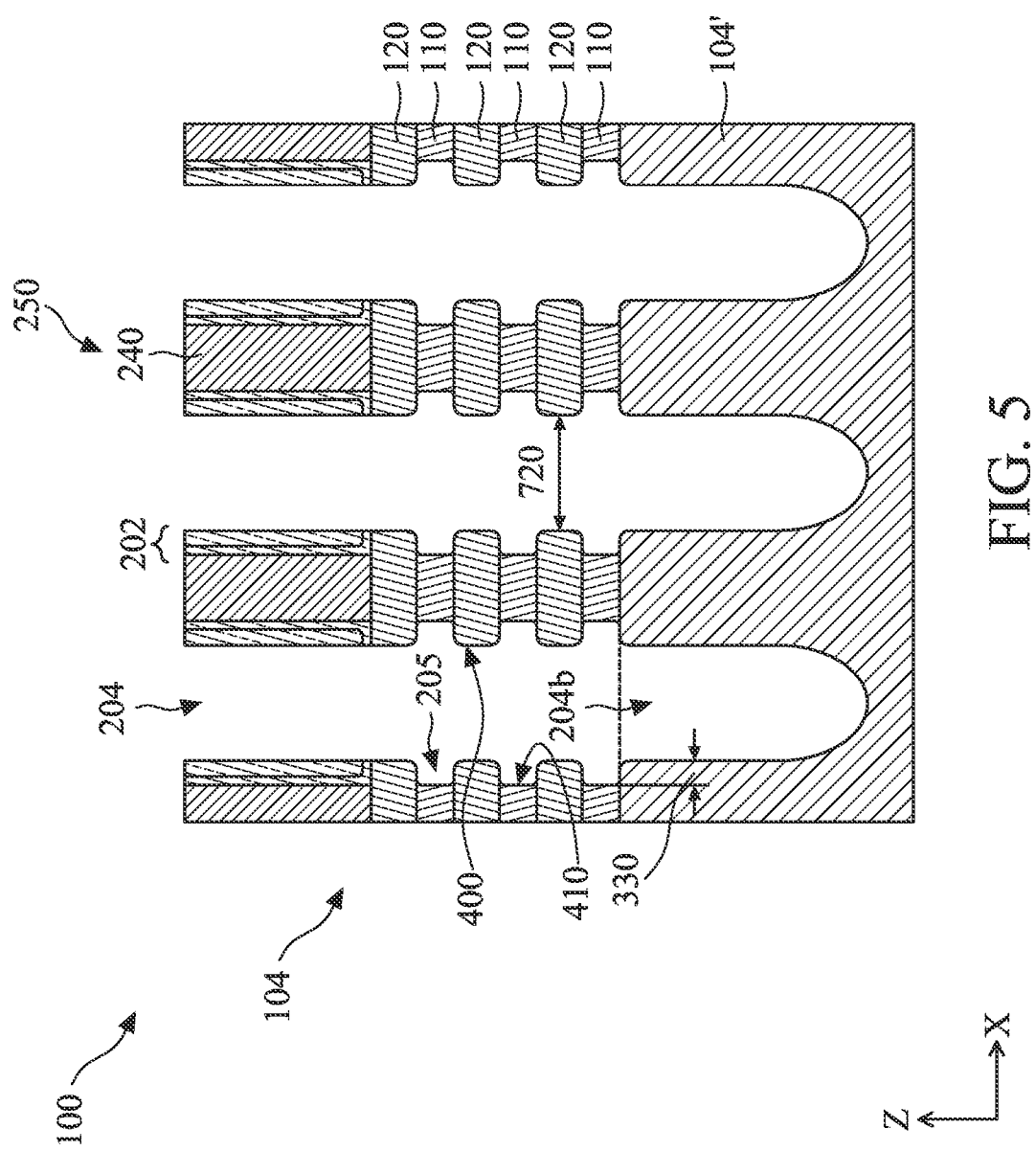

The openings 205 formed during the selective etching process extend the source/drain trenches 204 into areas beneath and between the semiconductor layers 120 and under the gate spacer layers 202. The extent to which the semiconductor layers 110 are laterally recessed (or the size of the portion removed) is determined by the processing conditions such as the duration that the semiconductor layers 110 is exposed to an etching chemical. In the depicted embodiments, the duration is controlled such that the opening 205 has a depth 330 along the X-direction. In some embodiments, the depth 330 is defined by the distance between the sidewall surfaces of the etched semiconductor layers 110 and the plane along which the sidewall surface of the semiconductor layers 120 extends. In some embodiments, the etching process conditions cause the openings 205 to have curved surfaces. For example, as illustrated in FIG. 5, the remaining portions of the semiconductor layers 110 may have a concave surface 410 facing the openings 205. Accordingly, the openings 205 may have a larger width (along the X-direction) at its mid-height (along the Z-direction) than at its top or bottom interfaces with the semiconductor layers 120 or with the substrate 102. In some embodiments, however, the remaining portions of the semiconductor layers 110 may instead have approximately straight (or flat surfaces).

The selective etching process may be any suitable processes. In the depicted embodiments, the semiconductor layers 120 include Si and the semiconductor layers 110 include SiGe. The selective etching process may be a wet etching process, such as a Standard Clean 1 (SC-1) solution. The SC-1 solution includes ammonia hydroxide ($NH_4OH$), hydrogen peroxide ($H_2O_2$), and water ($H_2O$). The SiGe semiconductor layers 110 may be etched away in the SC-1 solution at a substantially faster rate than the Si semiconductor layers 120. The etching duration is adjusted such that the size of the removed portions of SiGe layers is controlled. As a result, desired portions of the semiconductor layers 110 are removed while the semiconductor layers 120 are only minimally affected. The optimal condition may be reached by additionally adjusting the etching temperature, dopant concentration, as well as other experimental parameters. Additionally, the sidewalls of the semiconductor layers 120 may also have curved surfaces after the selective etching process completes. As described above, although the semiconductor layers 120 are largely preserved due to their etching resistance to the etching chemical, they nevertheless may have their profiles slightly modified, particularly in their end portions above and below the openings 205. For example, prior to the selective etching process, these end portions may have substantially straight sidewall surfaces (see FIG. 4). After the selective etching process, the sidewall surfaces become more rounded and with a convex profile facing the source/drain trenches 204. The sidewall surface after the selective etching process is referred to as surface 400. In other words, the semiconductor layers 120 may have a larger length along the X-direction at its mid-height (along the Z-direction) than at its top or bottom interfaces with the semiconductor layers 110 (and the openings 205). In some embodiments, opposing surfaces 400 of adjacent semiconductor layers 110 are separated by a distance (or separation) 720. In some embodiments, the separation 720 is about 10 nm to about 30 nm, similar to the separation 710 of FIG. 4. In some embodiments, however, the surfaces 400 may instead be straight (or flat). In still some embodiments, the surface 400 may instead be convex facing away from the source/drain trenches 204.

Figure 6:
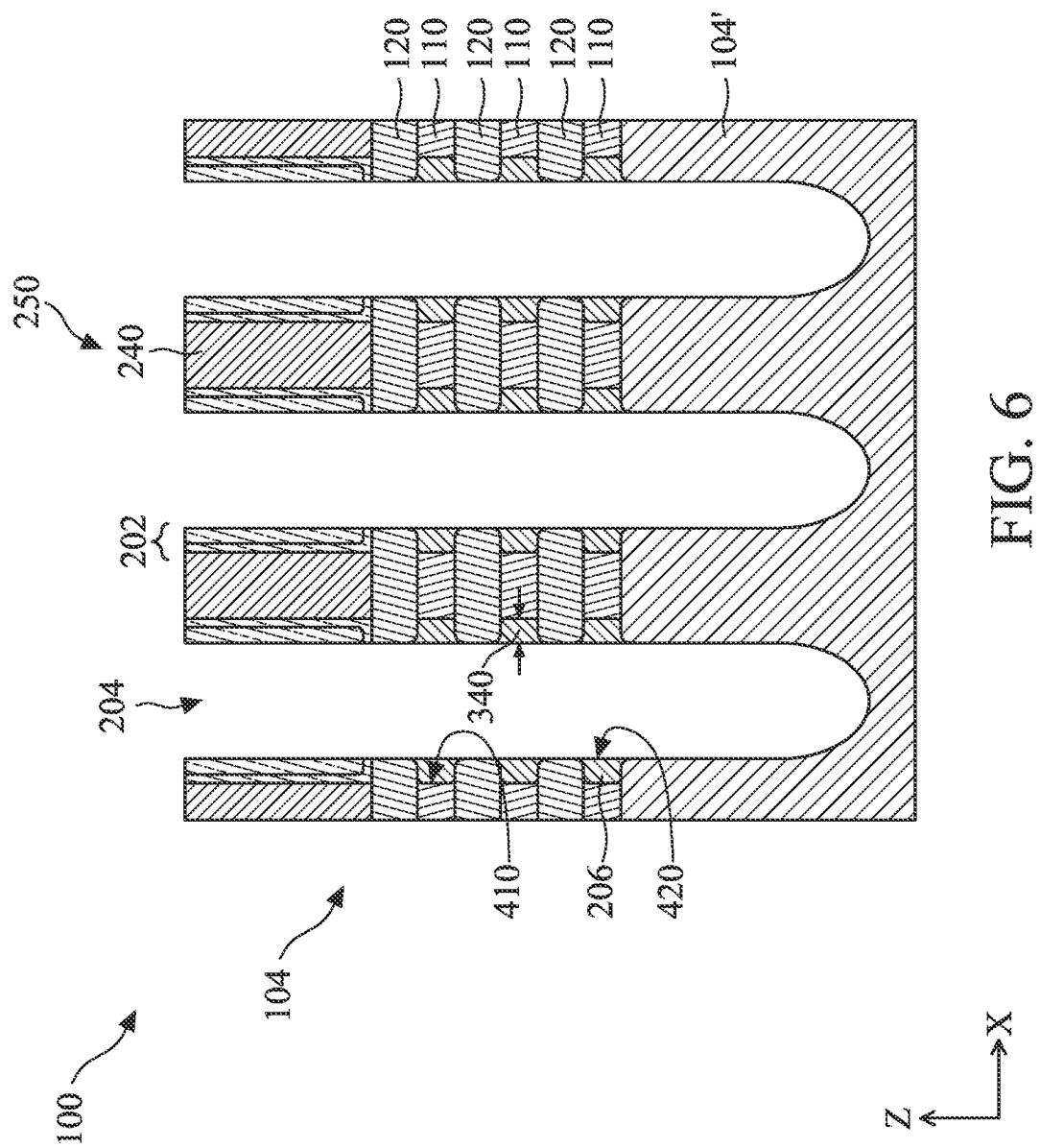

Referring to block 22 of FIG. 2A and FIG. 6, inner spacers 206 are formed in the source/drain trenches 204 and in the openings 205. In some embodiments, a dielectric material is deposited into both the source/drain trenches 204 and the openings 205 and subsequently partially removed to form the inner spacers 206. In an embodiment, the dielectric material may be selected from $SiO_2$, SiON, SiOC, SiOCN, or combinations thereof. In some embodiments, the proper selection of the dielectric material may be based on its dielectric constant. The deposition of the dielectric material may be any suitable methods, such as CVD, PVD, PECVD, MOCVD, ALD, PEALD, or combinations thereof. In some embodiments, the partial removal (or partial etching-back) completely removes the dielectric materials within the original source/drain trenches 204, but leaves at least a portion of the dielectric materials remaining in the original openings 205 (compare FIG. 5). Those remaining dielectric materials in the openings 205 become the inner spacers 206. Accordingly, the inner spacers 206 are formed between vertically adjacent end portions of the semiconductor layers 120. Alternatively or additionally, a masking element may also be used. The inner spacers 206 interface with the remaining portions of the semiconductor layers 110 at the surface 410. Additionally, the inner spacers 206 have a new surface 420 exposed in the source/drain trenches 204. The distance between the surfaces 410 and 420 defines the profiles and the lateral width 340 of the inner spacers 206. The new surface 420 may be of a same or different profile as that of the surface 410. In some embodiments, the lateral width 340 is about 3 nm to about 15 nm.

Referring to block 24 of FIG. 2A and FIGS. 7A-7C, the method 10 proceeds to form epitaxial source/drain features 500A in the source/drain trenches 204, and to partially fill the trench portions 204b. Although not explicitly depicted, the epitaxial source/drain features 500A may include one or more than one layers. In some embodiments, different layers of the epitaxial source/drain features 500A may have different semiconductor materials and/or different dopant compositions. In some embodiments, the source/drain features 500A are configured as n-type source/drain features. Accordingly, the source/drain features 500A include n-type semiconductor materials, such as silicon. Furthermore, the source/drain features 500A (or a portion thereof) includes a dopant element. The doping improves the mobility of charge carriers that migrate from one source/drain features 500A through the semiconductor layers 120 to another source/drain features 500A during the operation. For example, the dopant may include arsenic (As), phosphorous (P), antimony (Sb), bismuth (Bi), or combinations thereof.

In some embodiments, the source/drain features 500A are formed by an epitaxial process. The epitaxial process may include performing an epitaxial deposition/partial etch process and repeating the epitaxial deposition/partial etch process. Accordingly, the epitaxial process is a cyclic deposition/etch (CDE) process. Details of the CDE process has been described in U.S. Pat. No. 8,900,958 titled "Epitaxial formation mechanisms of source and drain regions" by Tsai and Liu, which is herein incorporated in its entirety for reference. Briefly, the deposition operation of the epitaxial process may implement gaseous or liquid precursors. The precursors may interact with the semiconductor materials of the substrate 102, thereby forming a semiconductor epitaxy. In some embodiments, the deposition operation may use chemical vapor deposition (CVD), atomic layer CVD (AL-CVD), ultrahigh vacuum CVD (UHVCVD), reduced pressure CVD (RPCVD), any suitable CVD; molecular beam epitaxy (MBE) processes; any suitable epitaxial process; or any combinations thereof. Then, an etching operation (such as a dry etching operation utilizing a halogen-based etching chemical) is conducted to remove amorphous semiconductor materials from the surface of the semiconductor epitaxy. In some embodiments, the etching operation also removes portions of the semiconductor epitaxy that include dislocations or other defects. Subsequently, another deposition operation is conducted to further grow and increase the thickness of the semiconductor epitaxy. The parameters of the etching and deposition operations (such as temperatures, duration, and etching chemical compositions) may be adjusted based on the desired feature profile, dimensions, or other characteristics. The cyclic process is repeated until a desired thickness of the epitaxial layer (as a part of the source/drain features 500A) is reached. In some embodiments, the epitaxial process may instead be a selective epitaxial growth (SEG) process. The selective epitaxial growth process utilizes simultaneous deposition and etch operations. In some embodiments, the epitaxial process may include both CDE operations and SEG operations.

Generally, the growth of the semiconductor epitaxy initiates from surfaces of the semiconductor materials and does not initiate from dielectric materials. At the beginning of the epitaxial process, both surfaces of the trench portions 204b and the sidewall surfaces 400 of the semiconductor layers 120 include such semiconductor materials. Accordingly, the growth of the source/drain features 500A initiates laterally from the surfaces 400 of the semiconductor layers 120; and vertically from the exposed bottom surfaces of the trench portions 204b. At the end of a first step of deposition 602 (FIG. 7A), a layer 1500A of epitaxy material are formed on surfaces of the trench portions 204b, and a layer 1500B of epitaxy material is formed on sidewall surfaces 400 of the semiconductor layers 120. Subsequently in a partial etching operation 604 (FIG. 7B), the layer 1500B on sidewall surfaces 400 of the semiconductor layers 120, along with a top section of the layer 1500A in the trench portions 204b are etched. In some embodiments, the partial etching operation 604 is configured to remove the layer 1500B in its entirety without removing all of the layer 1500A. As a result, the sidewall surfaces 400 of the semiconductor layers 120 are once again exposed in the source/drain trenches 204, and a reduced amount of epitaxy materials in the layer 1500A remain on surfaces of the trench portions 204b (as reflected in the reduced thickness). In a new growth cycle, another deposition step is conducted to form another layer of epitaxy material on the exposed sidewall surfaces 400 of the semiconductor layers 120 as well as on top surfaces of the layer 1500A in the trench portions 204b. Similarly, another partial etching operation is conducted to remove the portion of the epitaxy material on sidewall surfaces 400 as well as etching a portion (and not all) of the newly deposited epitaxy material in the trench portions 204b. Accordingly, the sidewall surfaces 400 are regenerated, while the thickness of the layer 1500A increases. This cyclic process is repeated until a desired thickness of the layer 1500A is reached.

The deposition may be conducted at a temperature T1 for a time duration t1. In some embodiments, T1 may be about 450° C. to about 650° C. If the temperature T1 is too high, the deposited material (or a surface portion thereof) may be flowable, such that location of the deposition may not be well regulated; if the temperature T1 is too low, dopants therein may not be properly activated. In some embodiments, t1 may be about 200 s to about 600 s. If the time duration t1 is too long, the source/drain features 500A so formed may have excessively large volume, for example, having a top surface that approaches the suspended channel layers, thereby inducing shorting in some circumstances. If the time duration t1 is too short, the source/drain features 500A may have insufficiently large volume such that conductivity may be too low to meet performance requirements. The etching may be conducted at a temperature T2 for a time duration t2. For example, the temperature T2 may be about 600° C. to about 700° C. If the temperature T2 is too high, the processing chamber may be damaged in some circumstances; if the temperature T2 is too low, the etching may be too inefficient such that the source/drain feature 500A so formed may not be properly densified. For example, the time duration t2 may be about 200 s to about 600 s. Moreover, a ratio of the time duration t2 to the time duration t1 may be about 1:1 to about 3:1. If the time duration of the t2 is too long, or if the ratio is too large, the growth rate for the source/drain feature 500A may be too small, or the quality of the source/drain feature 500A may be reduced; if the time duration t2 is too short, or if the ratio is too small, the complete removal of the material on sidewall surfaces 400 may be challenging. Furthermore, the epitaxy process may implement a cycle number N. in some embodiments, the cycle number N may be about 1 to about 20. If the cycle number N is too small, source/drain features 500A so formed may have inferior crystal quality; if the cycle number N is too large, any additional benefit is offset by the increase in processing cost. The epitaxy material may implement any suitable precursors. In some embodiments, the epitaxy materials implement silane ($SiH_4$), dichlorosilane ($SiH_2Cl_2$), other suitable precursors, or combinations thereof. For example, by using these precursor materials, quality of the source/drain feature 500A (e.g. conductivity) may be improved as compared to other alternative precursor materials.

Figure 7A:
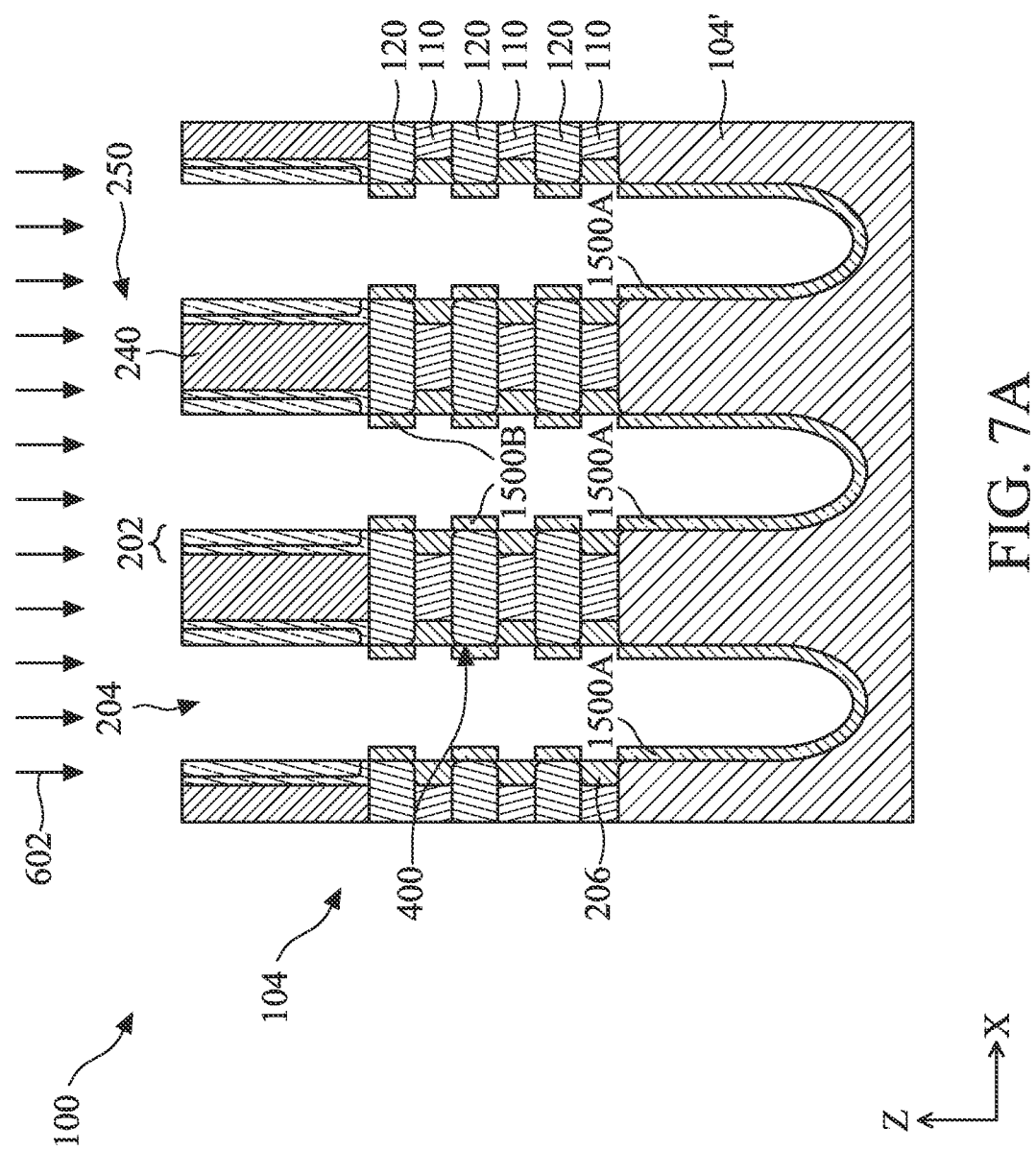
Figure 7B:
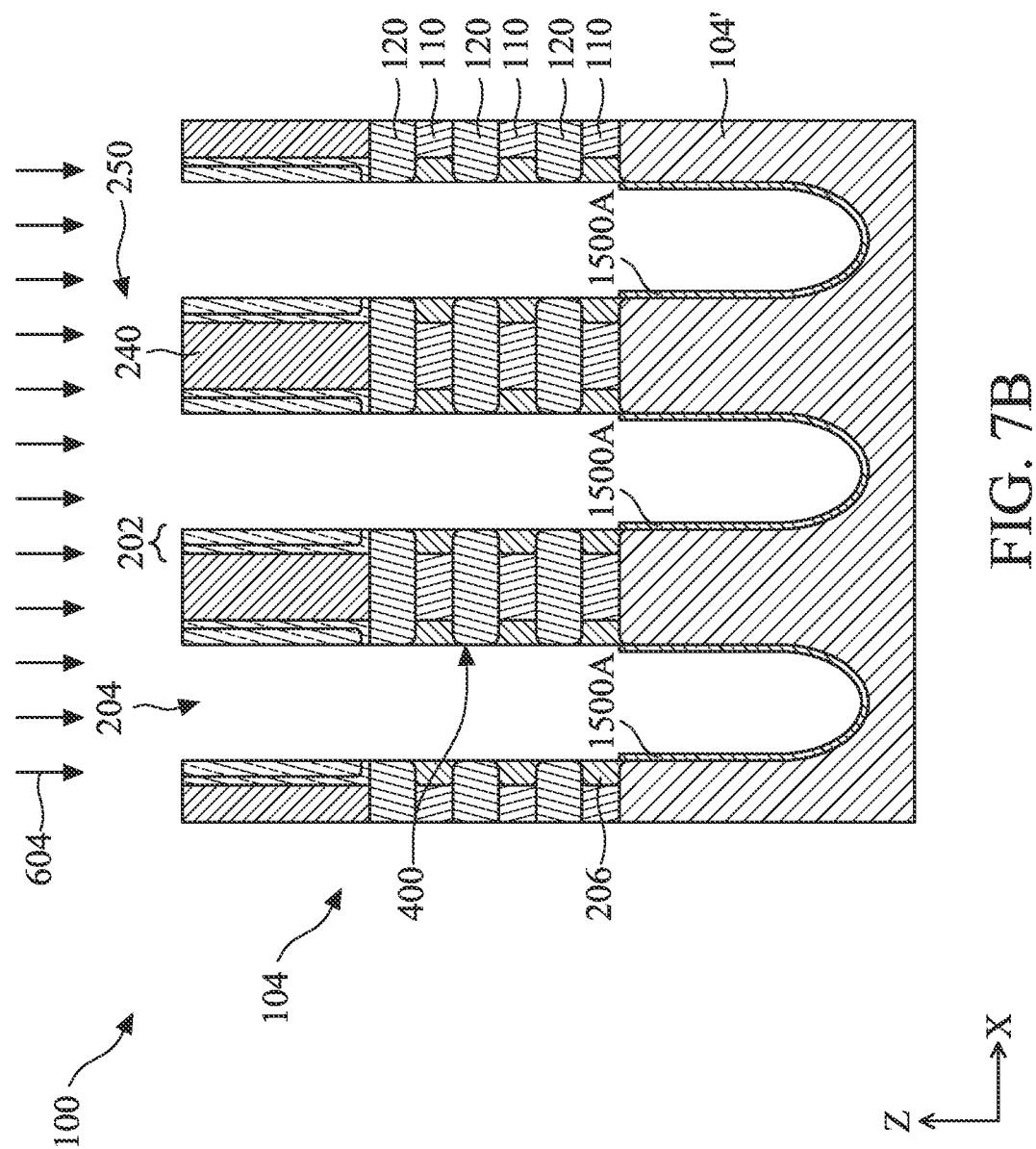
Figure 7C:
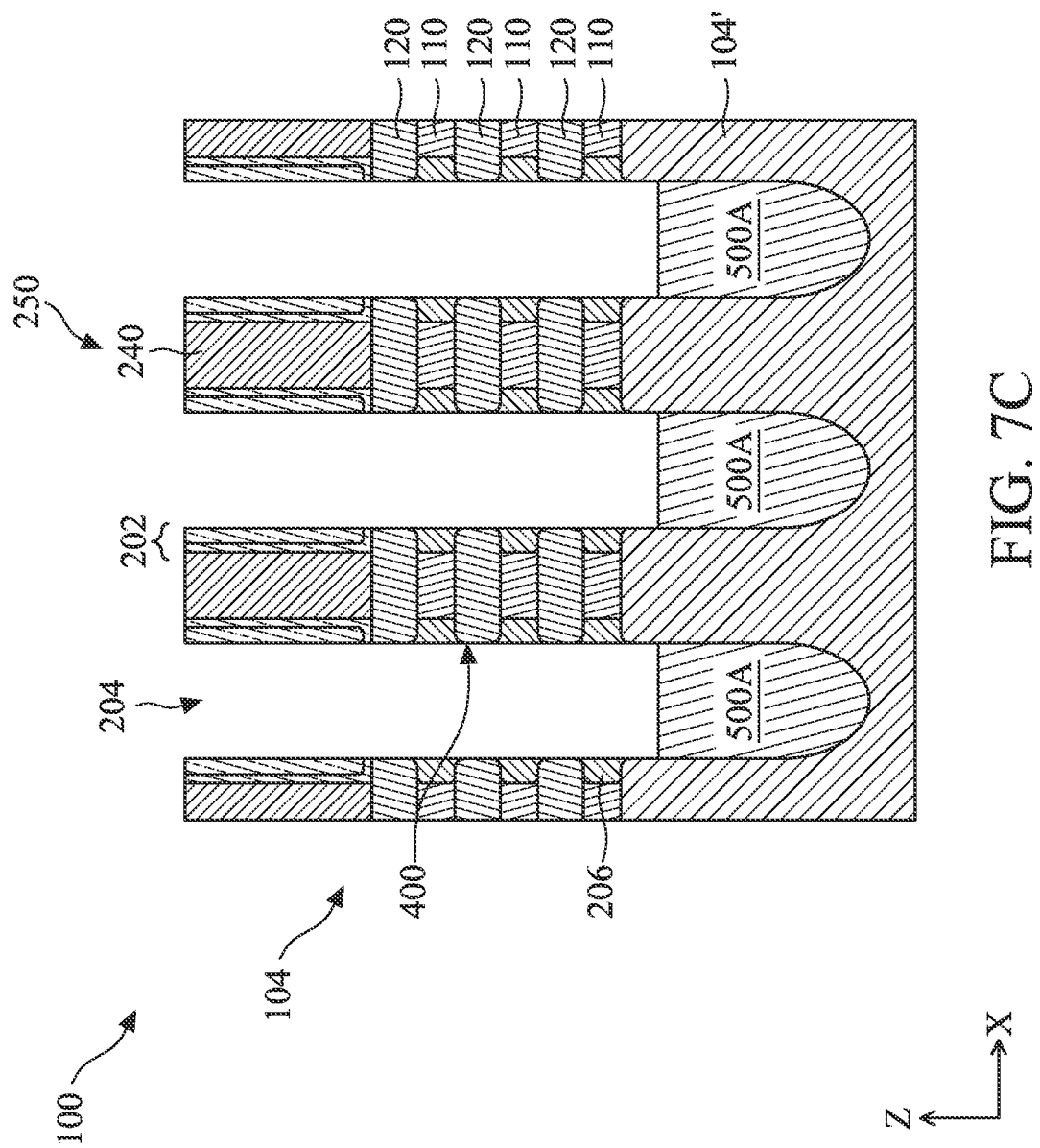

Referring to FIG. 7C, in some embodiments, at the end of the growth process, the layers 1500A of the epitaxy materials each have a thickness that substantially equals the height dimension 705 of FIG. 4. In other words, the layers 1500A substantially fills the trench portions 204b, thereby forming the source/drain features 500A. It is noted that although FIG. 7C illustrates the source/drain features 500A as having a flat top surface, depending on the growth and etching conditions, the source/drain features 500A may alternatively have a flat or convex top surfaces. Meanwhile, no epitaxy material remains on sidewall surfaces 400 of the semiconductor layers 120, and no epitaxy material are present on sidewall surfaces of the inner spacers 206.

Figure 8:
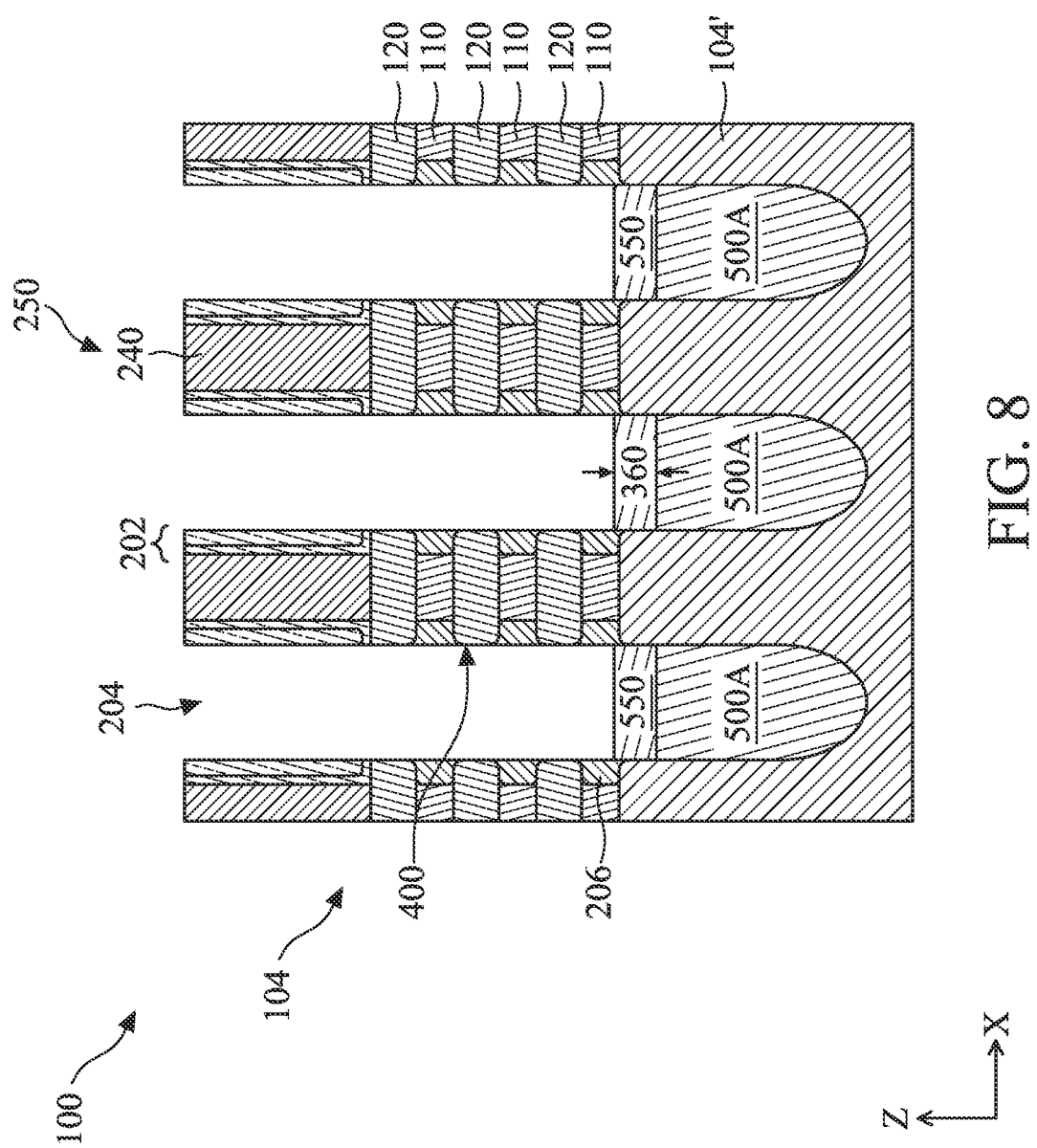

Referring to block 26 of FIG. 2A and FIG. 8, isolation features 550 are formed on top surfaces of the source/drain features 500A thereby covering all semiconductor materials that were otherwise exposed in the source/drain trenches 204. In some embodiments, prior to the formation of the isolation features 550, another partial etching is conducted to slightly reduce the height of the source/drain features 500A, such that a top surface of the source/drain features 500A extend below a top surface of the base fins 104' (and the bottom surfaces of the bottommost semiconductor layers 110). The isolation features 550 may be configured to include a dielectric material that has, for example, aluminum (Al), titanium (Ti), lithium (Li), hafnium (Hf), zirconium (Zr), lanthanum (La), molybdenum (Mo), cobalt (Co), silicon (Si), oxygen (O), nitrogen (N), carbon (C), any other suitable elements, or combinations thereof. In some embodiments, the isolation features 550 may include a low-k dielectric material having a k parameter less than about 3.9.

As described later, the isolation feature 550 separates two adjacent source/drain features and having a low k parameter improves the isolation therebetween. In some embodiments, the isolation features 550 may be silicon nitride, silicon carbonitride, silicon oxynitride, silicon carboxynitride, or combinations thereof. Any suitable methods may be used to form the isolation feature 550. In the depicted embodiments, the isolation feature 550 is formed using ALD, CVD, PVD, other suitable methods, or combinations thereof.

In the depicted embodiments, the isolation feature 550 is a conformal layer having a thickness 360. In some embodiments, the thickness 360 of the isolation feature 550 is about 5 nm to about 15 nm. In some embodiments, the isolation features 550 are configured to have a top surface that extends between a top surface of the bottommost semiconductor layer 110 and a bottom surface of the bottommost semiconductor layer 110. As described later, source/drain features 500B are formed on top surfaces of the isolation features 550. If the thickness 360 is too large, such as greater than about 15 nm, or if the top surface of the isolation feature 500 extends above a top surface of the bottommost semiconductor layers 110, at least some portion of the semiconductor layers 120 are covered by the isolation features 550 such that the otherwise available conductive pathway of that semiconductor layer 120 is reduced. This contributes to an increase in the resistance in operation. Moreover, the isolation features 550 are used to isolate the source/drain features 500A from subsequently formed source/drain features 500B on top of the isolation feature 550. If the thickness 360 of the isolation feature 550 is too small, such as less than about 5 nm, complete isolation between the source/drain features 500A and 500B may not be guaranteed in cases of operational defects or error, which may lead to device failures. If the top surface of the isolation features 550 extends below the bottom surfaces of the bottommost semiconductor layers 110, subsequently formed source/drain features 500B may directly contact sidewall surfaces of the base fins 104', thereby also lead to shorting.

Figure 9A:
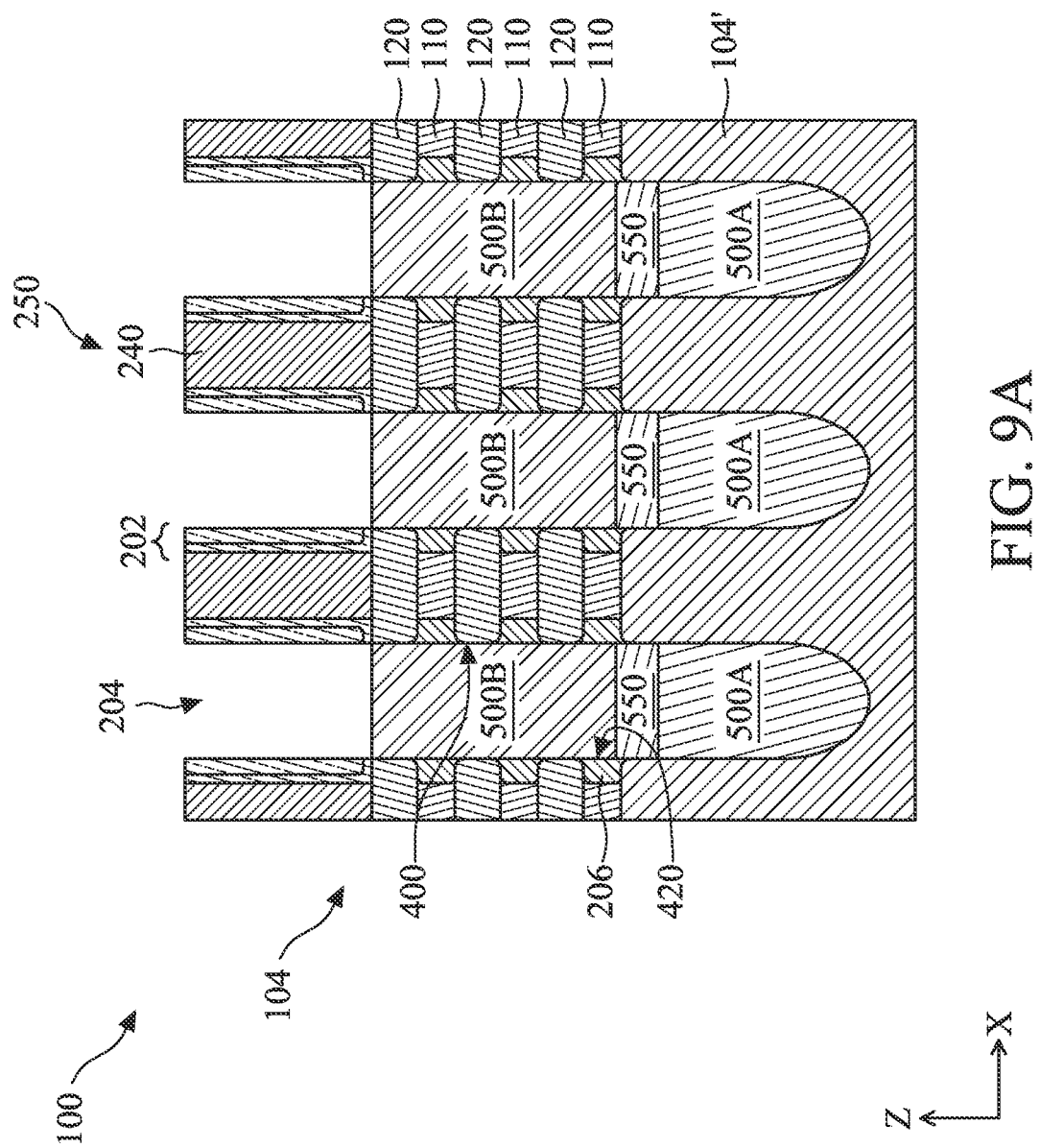
Figure 9B:
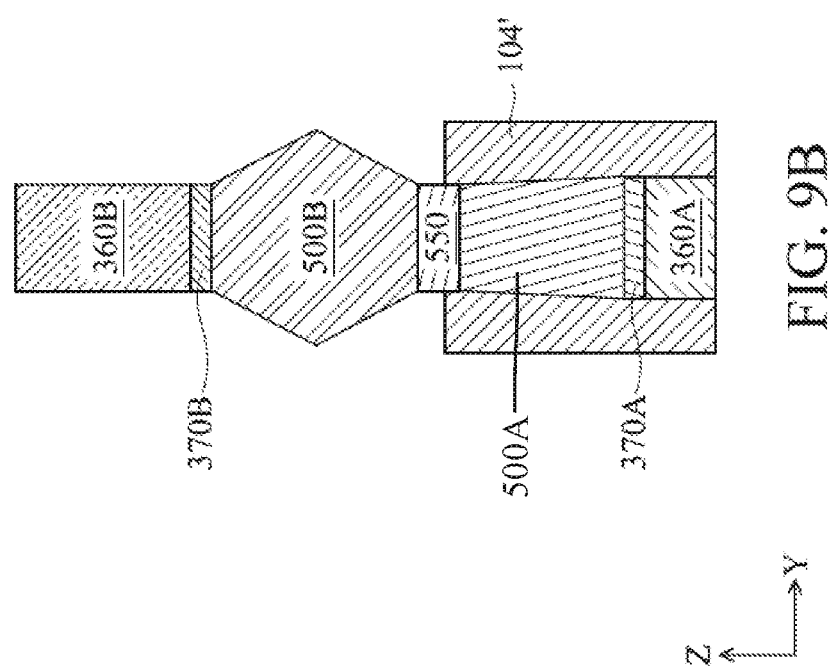
FIGS. 9B, 9D, and 14B are cross-sectional views of embodiments of nanosheet-based devices of the present disclosure along the line B-B' in FIG. 1A constructed at various fabrication stages according to some embodiments of the present disclosure.

Referring to block 28 of FIG. 2A and FIGS. 9A-9B, another epitaxy process is conducted to form source/drain features 500B on top of the isolation features 550. In some embodiments, the source/drain features 500B are configured as p-type source/drain features. Accordingly, the source/drain features 500B may include p-type semiconductor materials, such as Si, silicon germanium (SiGe), germanium (Ge), or combinations thereof. Moreover, the source/drain features 500B may further include a p-type dopant element, such as boron (B), boron fluoride ($BF_2$), gallium (Ga), other suitable p-type dopants, or combinations thereof.

As described above, the growth of the epitaxy materials generally only initiates from surfaces of semiconductor materials. At this processing stage, semiconductor materials of the base fins 104' and that of the source/drain features 500A have been entirely covered by the isolation features 550 or the inner spacers 206. Only sidewall surfaces 400 of the semiconductor layers are exposed in the remaining portions of the source/drain trenches 204. Accordingly, the epitaxy process initiates and proceeds from the sidewall surfaces 400.

In some embodiments, the epitaxy process may implement different processing conditions. The deposition may be conducted at a temperature T1' for a time duration t1'. In some embodiments, T1' may be about 500° C. to about 700° C. A ratio of the temperature T1' to the temperature T1 may be about 1:1 to about 5:1. If the temperature T1' is too high or if the ratio is too large, the device reliability may not past the desired threshold; if the temperature T1 is too low or if the ratio is too small, the source/drain features 500B may not have the optimized quality. In some embodiments, t1' may be about 20 s to about 100 s. A ratio of the time duration t1' to the time duration t1 may be about 2:1 to about 5:1. If the time duration t1' is too long or if the ratio is too large, concerns with dopant activation overload may arise; if the time duration t1' is too short or if the ratio is too small, the source/drain features 500B so formed may possess reduced conductivity. The etching may be conducted at a temperature T2' for a time duration t2'. For example, the temperature T2' may be about 300° C. to about 500° C. A ratio of the temperature T2' to the temperature T2 may be about 1:1 to about 6:1. If the temperature T2' is too high or if the ratio is too large, the excessive etching may prevent efficient growth the source/drain features 500B from reaching the desired volume, which in some circumstances, may lead to open circuit; if the temperature T2' is too low or if the ratio is too small, in some circumstances, shorting concerns may arise. For example, the time duration t2' may be about 20 s to about 100 s. Moreover, a ratio of the time duration t2' to the time duration t2 may be about 3:1 to about 10:1. If the time duration of the t2' is too long, or if the ratio is too large, excessive dopant loss may occur; if the time duration t2' is too short, or if the ratio is too small, impurity may become a concern which leads to yield loss. Furthermore, in some embodiments, the cycle number N' may be about 1 to about 20. A ratio of the cycle number N' to the cycle number N may be about 3 to about 6. If the cycle number is too small or if the ratio is too small, conductivity may suffer; if the cycle number is too large or the ratio is too large, surface damages to the device may arise. The epitaxy material may implement any suitable precursors. In some embodiments, the epitaxy materials implement silane ($SiH_4$), dichlorosilane ($SiH_2Cl_2$) along with hydrogen chloride (HCl), other suitable precursor materials, or combinations thereof. For example, by using these precursor materials, source/drain features 500B with improved quality may be received.

In other approaches not implementing the methods described herein, the source/drain features of the same conductivities are often configured to extend from the bottom of the source/drain trenches 204 (see FIG. 6), which is also a surface of the base fin 104' with semiconductor materials exposed thereon, to reach top surfaces of the topmost semiconductor layers 120. By contrast, as can be seen from the discussion above, source/drain features 500A and 500B occupying a same source/drain trench, are configured differently. For example, as described above, the source/drain features 500A may be configured to be n-type source/drain features while the source/drain features 500B may be configured to be p-type source/drain features. Although not explicitly illustrated, alternatively, the source/drain features 500A may be configured to be p-type source/drain features while the source/drain features 500B may be configured to be n-type source/drain features. In other words, the source/drain features of different conductivity types may be formed in a same source/drain trench 204 and stacked one over another. The dopant identities, profiles, and concentrations in the source/drain features 500A and 500B may also be different from each other. Such stacked source/drain features 500A and 500B are isolated from each other by the isolation features 550 (and air gaps 550', if present). The source/drain features 500A and 500B have different profiles. For example, the source/drain features 500A in the trench portions 204b have profiles that are determined by the profiles of the source/drain trench portions 204b. Accordingly, the source/drain features 500A may have a profile that resembles a "U" shape on the XZ plane (FIG. 9A); while having a trapezoid on the YZ plane (FIG. 9B). However, the source/drain features 500B are instead confined by the semiconductor layers 120 and the inner spacers on the XZ plane, and not substantially constrained on the YZ plane. Accordingly, the source/drain features 500B may have sidewall surfaces that are substantially parallel to each other on the XZ plane, but having a profile resembling a hexagon on the YZ plane. Accordingly, rather than forming CMOS device with PMOS and NMOS transistors each configured as separate nanosheet-based transistors arranged side-by-side on a semiconductor substrate, the present disclosure provides the CMOS device having the NMOS transistor occupying a bottom portion of the nanosheet-based structure, and the PMOS transistor occupying a top portion of the nanosheet-based structure (or vice versa). Accordingly, the CMOS device 100 occupies significantly less chip area than those other approaches. In such configurations, the lower transistor (e.g. the NMOS) has a configuration that resembles a conventional MOSFET, while the top transistor (e.g. the PMOS) has a configuration that resembles a conventional nanosheet-based transistor (or portions thereof). Although FIGS. 9A and 9B illustrate the source/drain features 500A having a flat top surface, depending on the growth and etching parameters, the top surface of the source/drain features 500A, and consequently the isolation features 550, air gaps 550', and the bottom surfaces of the source/drain features 550B may have concaved, flat, or convex profiles.

Figure 9C:
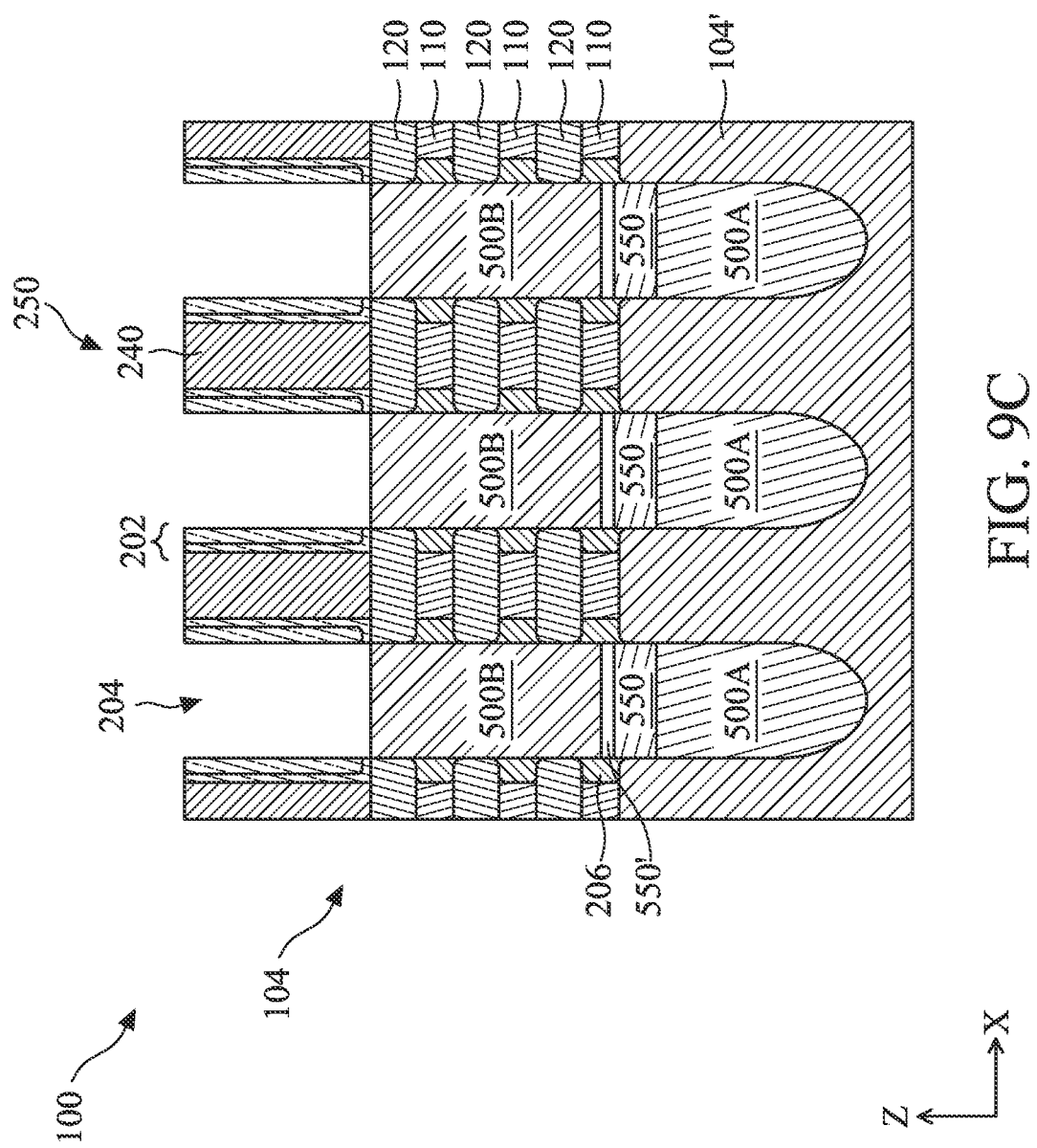
Figure 9D:
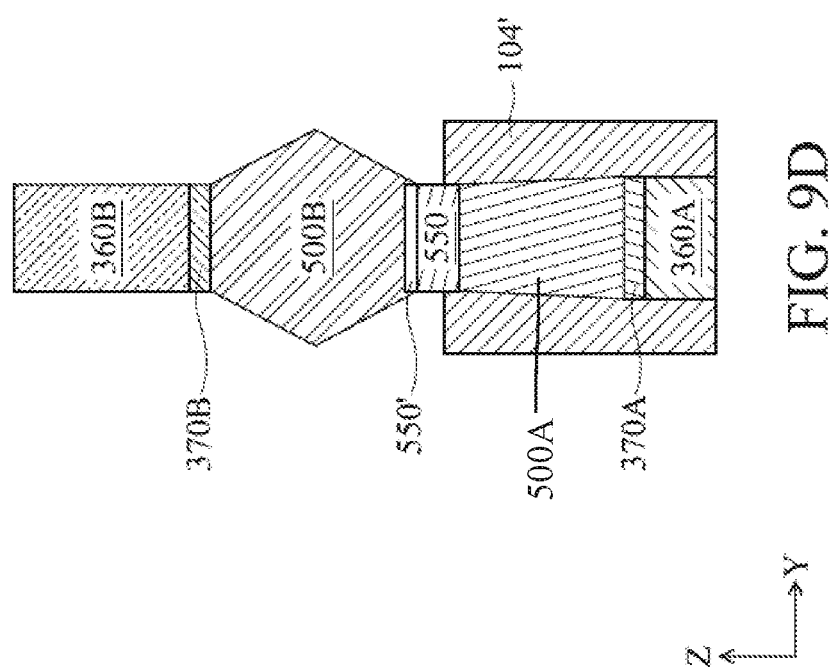

In some embodiments, referring to FIGS. 9C-9D, the epitaxy process may be configured to form an air gap 550' between the source/drain features 500B and the isolation features 550. The air gaps 550' further improves isolations between the source/drain features 500A and the source/drain features 500B. For example, the presence of the air gaps 550' completely cuts off any migration pathway for the charge carriers during operation. Although FIG. 9C illustrates a configuration where the air gap 550' extends across the entire lateral dimension (along the X-direction) of the source/drain features 500A and 500B, the air gap 550' may be configured to have any other suitable configurations not explicitly illustrated here. For example, the air gap 550' may have a random profile with varying thicknesses across its profile. For example, there may be points of contact between the source/drain feature 500B and the isolation feature 550, such that the air gap 550' is segregated into multiple smaller air gaps. These and additional configurations are contemplated by the present disclosure.

Referring to block 30 of FIG. 2B, an interlayer dielectric (ILD) layer 350 is formed over the epitaxial source/drain features 500B and between adjacent gate stacks 240 and gate spacers 202, as well as vertically over the isolation features 150. In some embodiments, an etch-stop layer 220 may be formed in between the ILD layer 350 and the source/drain features 500B. The ILD layer 350 may also be formed in between the adjacent gate structures 250 along the X-direction, and in between the adjacent epitaxial source/drain features 500B along the Y-direction. The ILD layer 350 may include a dielectric material, such as a high-k material, a low-k material, or an extreme low-k material. For example, the ILD layer 350 may include $SiO_2$, SiOC, SiON, or combinations thereof. The ILD layer 350 may include a single layer or multiple layers, and may be formed by a suitable technique, such as CVD, ALD, and/or spin-on techniques. After forming the ILD layer 350, a CMP process may be performed to remove excessive ILD layer 350 and planarized the top surface of the ILD layer 350. Among other functions, the ILD layer 350 provides electrical isolation between the various components of the device 100.

Figure 10:
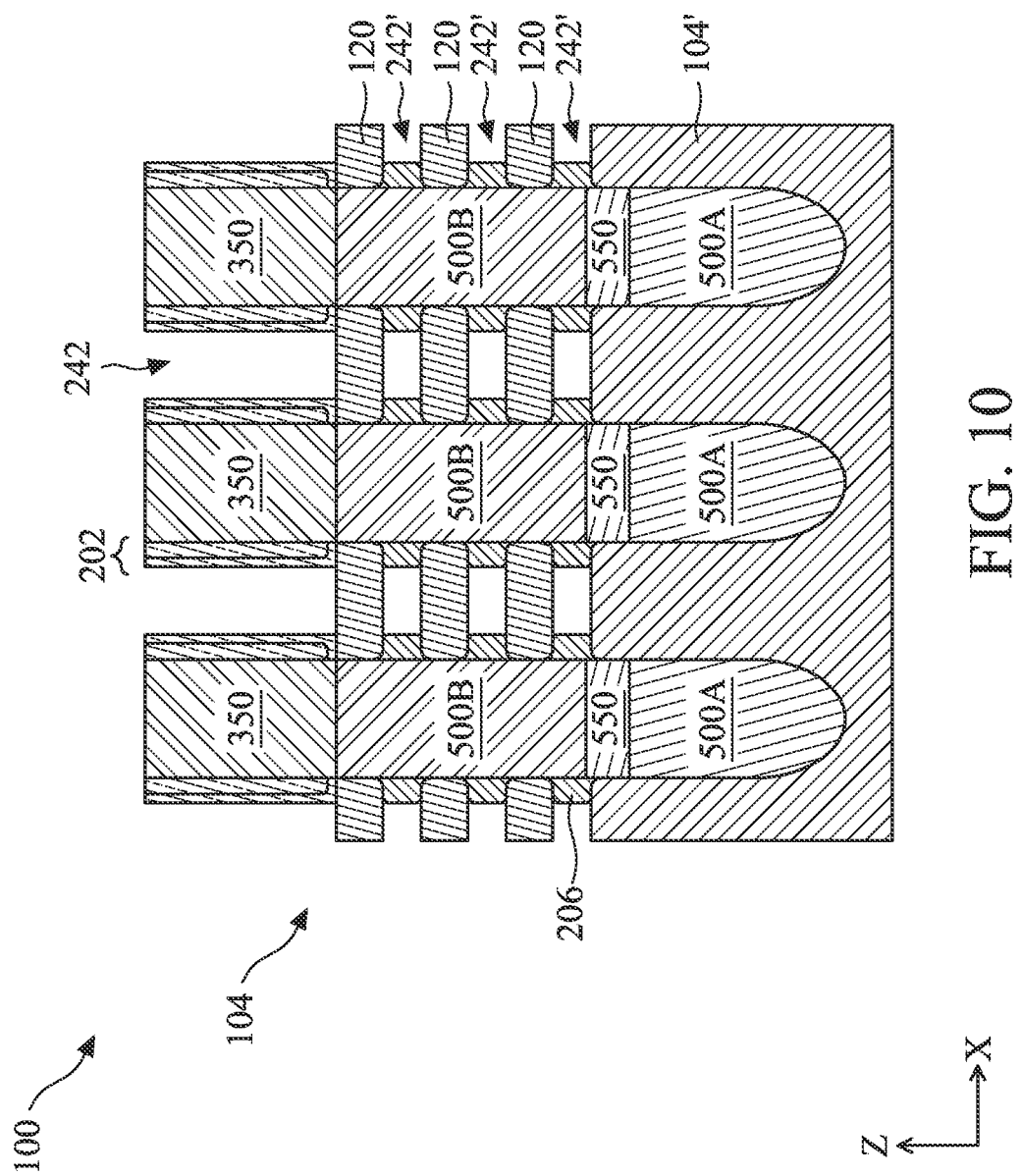

Referring to block 32 of FIG. 2B and FIG. 10, the dummy gate stacks 240 are selectively removed. The removal of the dummy gate stacks 240 creates gate trenches 242, which expose the respective top surfaces and the side surfaces of the semiconductor stacks (along the Y direction). The removal processes may be selected from any suitable lithography and etching processes. In some embodiments, the lithography process may include forming a photoresist layer (resist), exposing the resist to a patterned radiation, performing a post-exposure bake process, and developing the resist to form a masking element, which exposes a region including the gate structures 250. Then, the dummy gate stacks 240 are selectively etched through the masking element. In some other embodiments, the gate spacer layers 202 may be used as the masking element or a part thereof.

Referring to blocks 34 of FIG. 2B and FIG. 10, the remaining portions of the semiconductor layers 110 are selectively removed through the exposed side surfaces of the semiconductor stack. Similar to the selective etching processes described above with respect to FIG. 5, this process may be configured to completely remove the semiconductor layers 110 without substantially affect the semiconductor layers 120. The removal of the remaining portions of the semiconductor layers 110 form suspended semiconductor layers 120, as well as openings 242' in between the vertically adjacent semiconductor layers 120. Accordingly, the center portions of the semiconductor layers 120 each have exposed top, bottom, and sidewall surfaces. In other words, the center portions of each of the semiconductor layers 120 are now exposed circumferentially around the X-direction. The semiconductor layers 120 are now "suspended" semiconductor layers 120. This process may implement any suitable etching methods, such as a dry etching method, a wet etching method, or combinations thereof.

Figure 11:
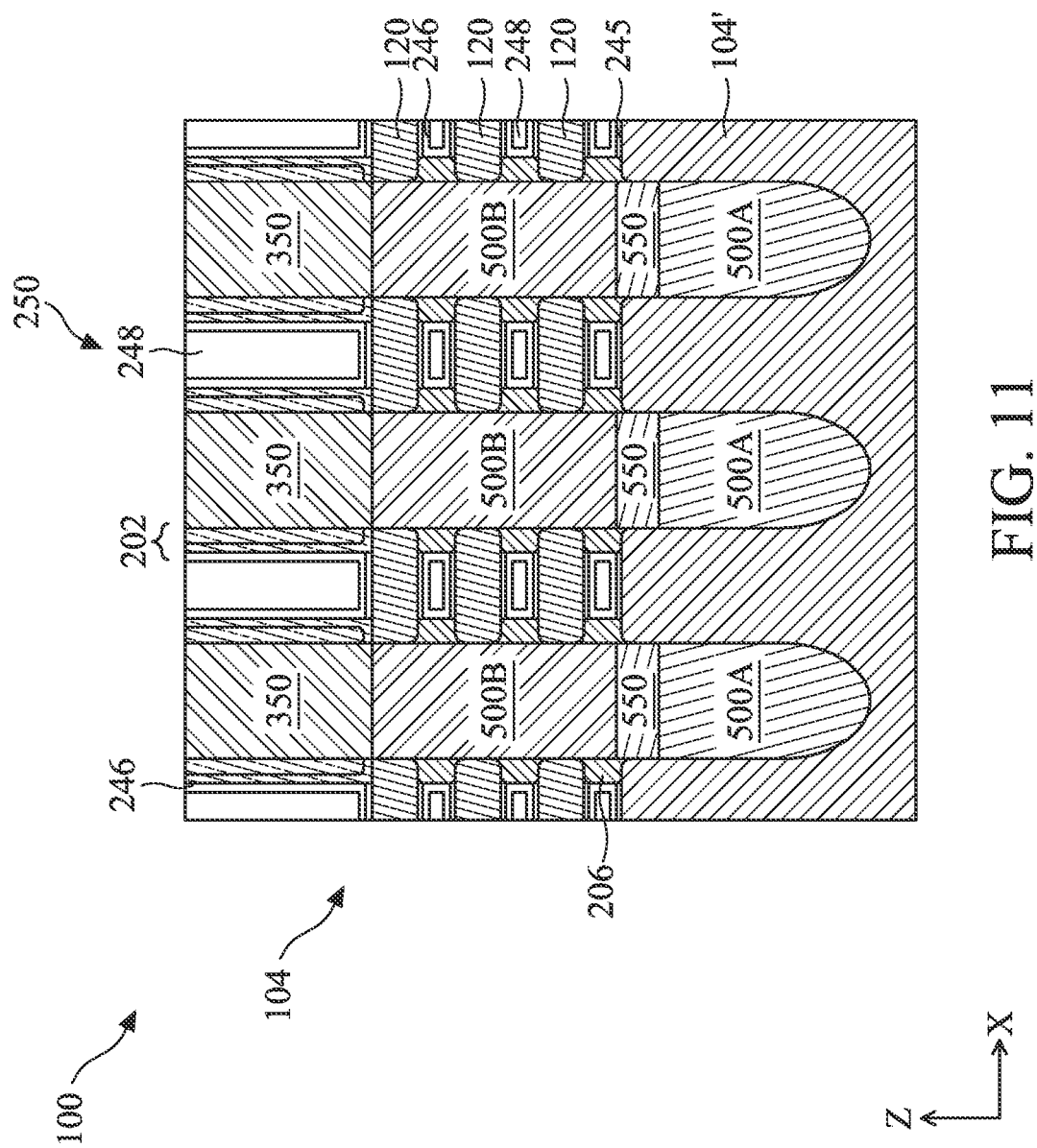

Referring to block 32 of FIG. 2B and FIG. 11, functional gate stacks are formed in the gate trenches 242 and openings 242' between suspended semiconductor layers 120. For example, a gate dielectric layer 246 is formed over and between the semiconductor layers 120, and a conductive metal layer 248 is formed over and between the portions of the gate dielectric layers 246. In some embodiments, the gate dielectric layer 246 may be a high-k dielectric layer. Accordingly, the functional gate stack may also be referred to as high-k metal gate stack. The high-k gate dielectric layer 246 may be formed conformally such that it at least partially fills the gate trenches 242 and the openings 242'. In some embodiments, the high-k gate dielectric layer 246 may be formed around the exposed surfaces of each of the semiconductor layers 120, such that it wraps around each of the semiconductor layers 120 in 360°. The high-k gate dielectric layer 246 may further be formed over the side surfaces 410 of the inner spacers 206, and the gate spacer layers 202. The high-k gate dielectric layer 246 may contain a high-k dielectric material. For example, the high-k gate dielectric layer 246 may include hafnium oxide ($HfO_2$), which has a dielectric constant in a range from about 18 to about 40. As various other examples, the high-k gate dielectric layer may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the high-k gate dielectric layer 246 may be by any suitable processes, such as CVD, PVD, ALD, or combinations thereof.

In some embodiments, an interfacial layer 245 is formed to interpose between the semiconductor layers 120 and the gate dielectric layers 246. Any suitable methods may be used to form the interfacial layer, such as ALD, CVD, or other deposition methods. Alternatively, the interfacial layer 245 may also be formed by an oxidation process, such as thermal oxidation or chemical oxidation. In this instance, no interfacial layer is formed on the sidewalls of the inner spacers 206 or the gate spacer layers 202. In many embodiments, the interfacial layer 245 improves the adhesion between the semiconductor substrate and the subsequently formed high-k dielectric layer 246. However, in some embodiments, the interfacial layer 245 is omitted.

The conductive metal layer 248 is formed over the gate dielectric layer 246 and fills the remaining spaces of the gate trenches 242 and the openings 242' between suspended semiconductor layers 120. The conductive metal layer 248 may include any suitable conductive materials, such as titanium (Ti), aluminum (Al), tantalum (Ta), titanium aluminum (TiAl), titanium aluminum nitride (TiAlN), tantalum carbide (TaC), tantalum carbide nitride (TaCN), tantalum silicon nitride (TaSiN), titanium nitride (TiN), ruthenium (Ru), iridium (Ir), osmium (Os), rhodium (Rh), aluminum (Al), tungsten (W), copper (Cu), cobalt (Co), nickel (Ni), platinum (Pt), ruthenium (Ru), or combinations thereof. In some embodiments, a CMP is performed to expose a top surface of the ILD layer 350. The gate dielectric layer 246 and the conductive metal layer 248 collectively form the functional gate stack. The functional gate stack and the gate spacer layers 202 collectively form the new gate structures 250. Although not explicitly depicted, in some embodiments, the gate dielectric layer 246 and the conductive metal layer 248 may be configured to be different in the bottommost openings 242' (and on the base fin 104') than in the upper openings 242' and in the gate trenches 242 (surrounding the suspended semiconductor layers 120). In other words, the gate structures 250 may each include upper gate portions engaging multiple semiconductor layers 120 to form multiple gate channels for the top transistor (such as the PMOS) and a bottom gate portion engaging with the base fin 104' to form the bottom channel for the bottom transistor (such as the NMOS). Accordingly, in some embodiments, an n-type work function metal may be formed to directly contact the gate dielectric layer 246 in the bottommost openings 242' (and on the base fin 104'); while a p-type work function metal may be formed to directly contact the gate dielectric layer in the upper openings 242' and in the gate trenches 242 on and surrounding the multiple semiconductor layers 120. Any suitable methods may be implemented to form the different gate portions. In some embodiments, parameters of the depositions and the etching may be configured to allow for selective deposition in the bottommost opening 242' or selective etching from the upper openings 242'.

Figure 12:
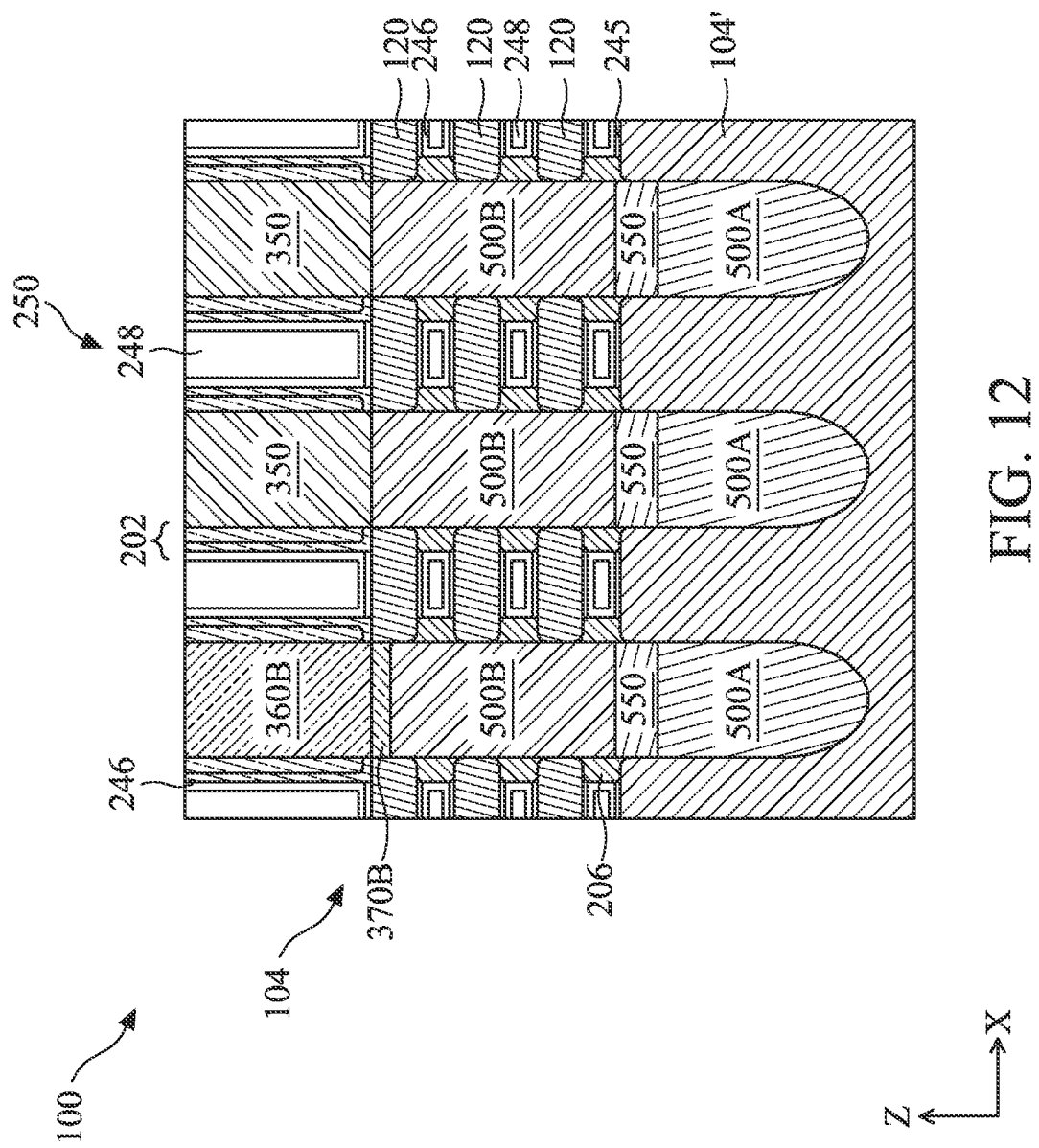

Referring to block 34 of FIG. 2B and FIG. 12, the method 10 proceeds to form a contact feature 360B to connect to the source/drain features 500B. In some embodiments, a mask element is formed to cover the top surface (or frontside) of the device 100 while leaving an opening above the source/drain features 500B to which the contact feature 360B will connect to. The portions of the ILD layer 350 exposed by the masking element is then removed to expose the top surfaces of the source/drain features 500B. A conductive material is deposited onto the top surfaces of the source/drain features 500B to form the contact feature 360B. In some embodiments, a silicide feature 370B is also formed at the interface of the contact feature 360B and the source/drain feature 500B. In some embodiments, the forming of the silicide feature 370B includes annealing to induce a chemical interaction between the conductive materials of the contact feature 360B and the source/drain features 500B.

Figure 13:
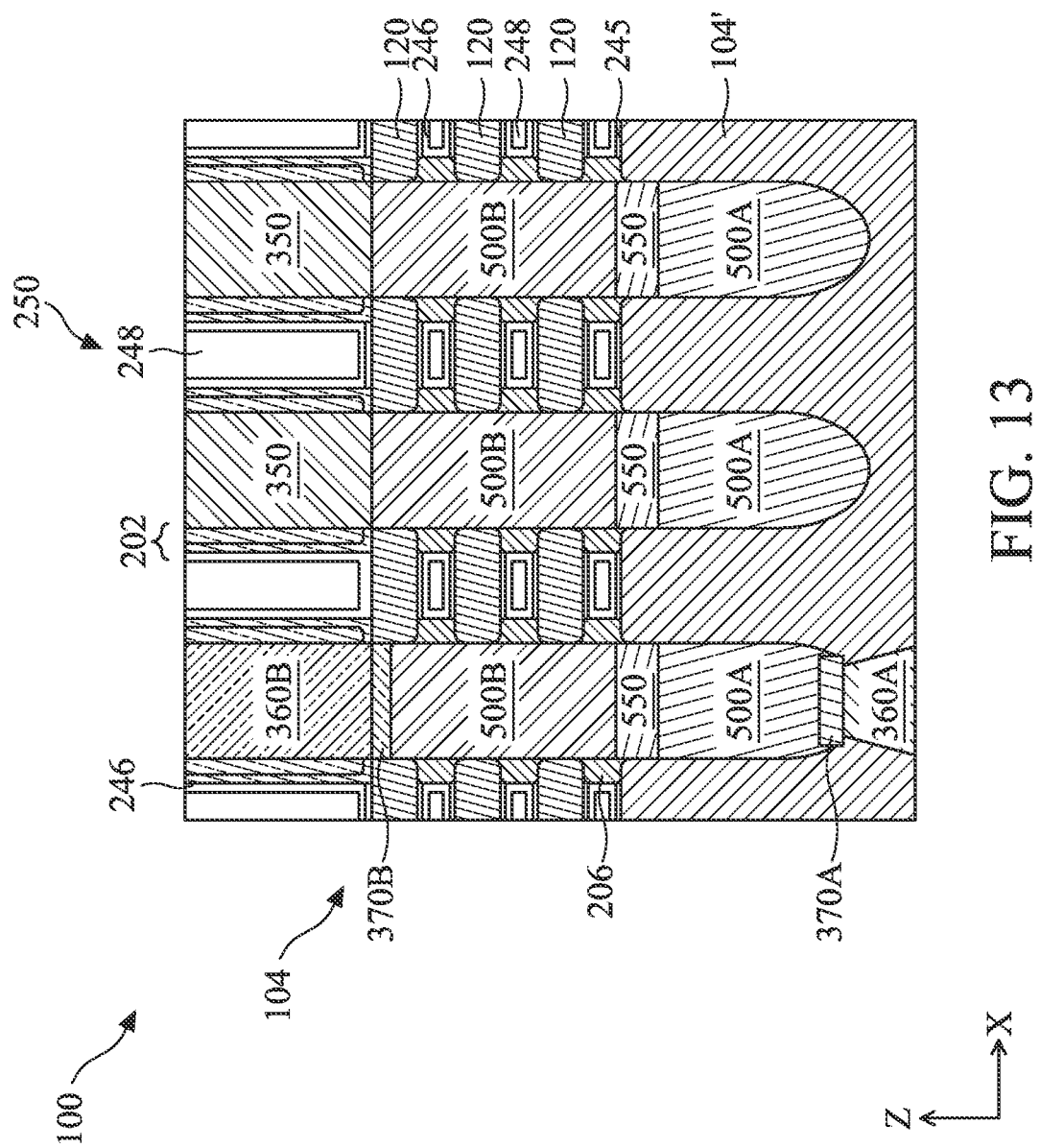
Figure 14A:
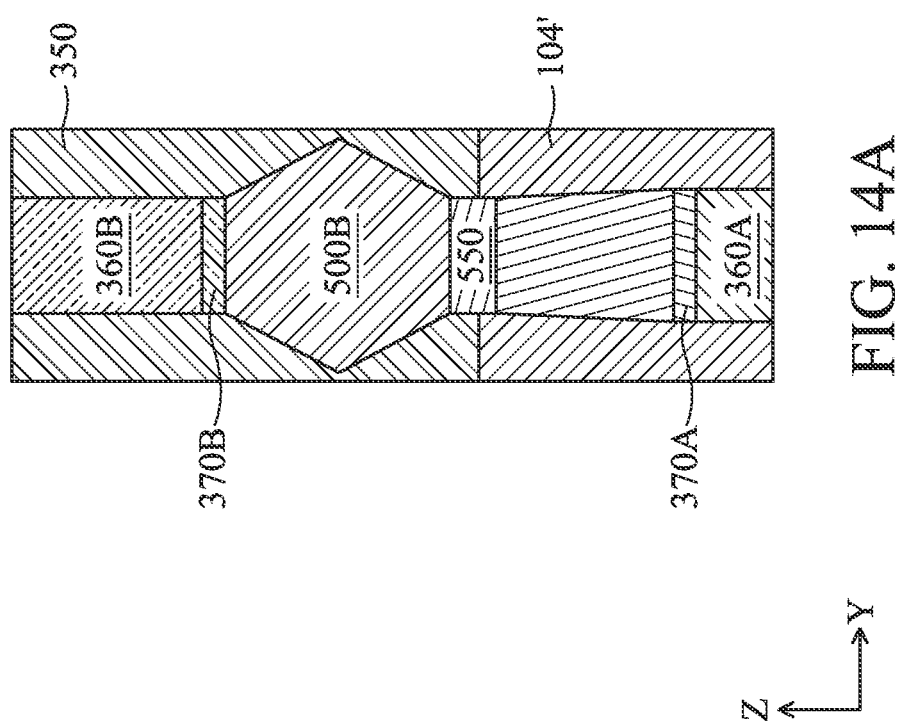
Figure 14B:
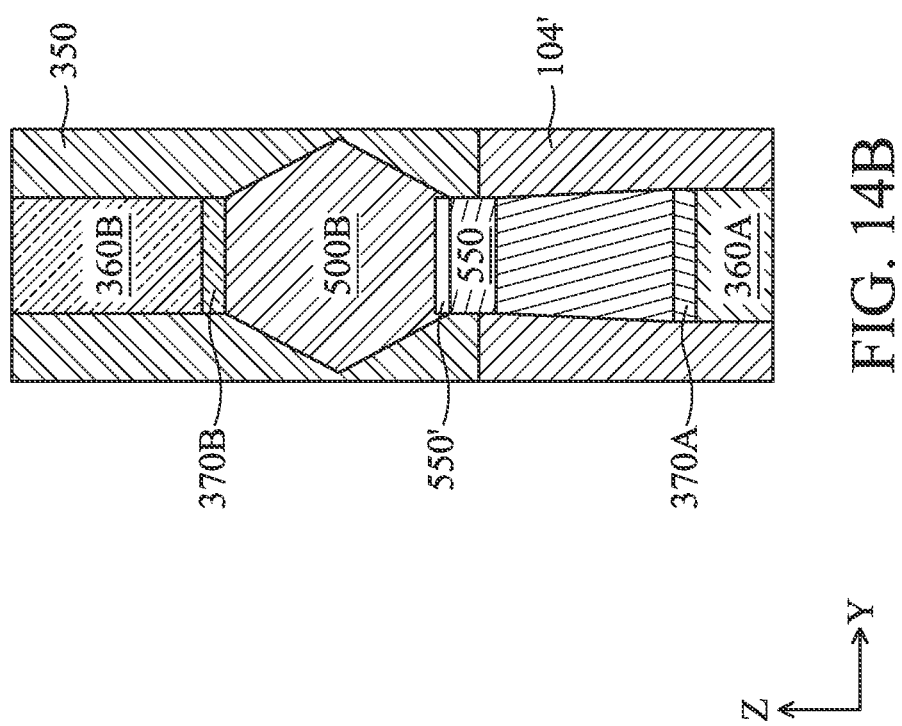

Referring to block 36 of FIG. 2B and to FIG. 13, the method 10 proceeds to form another contact feature 360A to connect to the source/drain features 500A. In the depicted embodiments, the contact feature 360A is formed on a backside of the device 100. For example, the device 100 is bonded to a carrier wafer on the frontside and flipped over, such that the backside of the device 100 is facing upwards for further processing. In some embodiments, a mask element is formed to cover the bottom surface (or backside) of the device 100 (now facing upward) while leaving an opening above the source/drain features 500A to which the contact feature 360A will connect to. The portions of the substrate 104' exposed by the masking element is then removed to expose the surfaces of the source/drain features 500A. A conductive material is deposited onto the exposed surfaces of the source/drain features 500A to form the contact feature 360A. In some embodiments, a silicide feature 370A is also formed at the interface of the contact feature 360A and the source/drain feature 500A. In some embodiments, the contact feature 360A are configured to be integrated to backside interconnect features.

Referring to block 38 of FIG. 2B, the method 10 proceeds to form additional necessary features to complete the fabrication of the device 100. For example, via features, metal line features, and passivation features are formed. It is noted that method 10 above describes example methods of the present disclosure. Processing steps may be added to or eliminated from the methods 10 before or after any of the described steps. Additional steps can be provided before, during, and after the method 10, and some of the steps described may be replaced or eliminated, for additional embodiments of the method. It is further understood that additional features can be added in the device 100, and some of the features described may be replaced or eliminated, for additional embodiments of the device 100.

Different embodiments may provide different benefits, and not all benefits are required for any specific embodiment. In an exemplary aspect, the present disclosure is directed to a device. The device includes a fin-shaped structure extending lengthwise along a first direction. The fin-shaped structure includes a stack of semiconductor layers arranged one over another along a second direction perpendicular to the first direction. The device also includes a first source/drain feature of a first dopant type on the fin-shaped structure and spaced away from the stack of semiconductor layers. The device further includes a second source/drain feature of a second dopant type on the fin-shaped structure over the first source/drain feature along the second direction and connected to the stack of semiconductor layers. The second dopant type is different from the first dopant type. Furthermore, the device additionally includes an isolation feature interposing between the first source/drain feature and the second source/drain features.

In some embodiments, the device further includes a first contact connected to the first source/drain feature on a first side of the fin-shaped structure along the second direction, and a second contact connected to the second source/drain features on a second side of the fin-shaped structure along the second direction, where the second side is opposite to the first side. In some embodiments, the device further includes a semiconductor channel connected to the first source/drain feature, and a gate structure on the semiconductor channel and on and between the stack of semiconductor layers. The gate structure extends lengthwise along a third direction perpendicular to the first direction and perpendicular to the second direction. Moreover, the stack of the semiconductor layers are over the semiconductor channel along the second direction. In some embodiments, the isolation feature interfaces with the first source/drain feature on a first feature surface and interfaces with the second source/drain feature on a second feature surface, where the first feature surface is spaced away from the second feature surface. In some embodiments, a bottom surface of the second source/drain feature and a top surface of the isolation feature define an air gap. In some embodiments, the device further includes an inner spacer between the gate structure and the second source/drain feature, where a sidewall surface of the inner spacer is partially exposed in the air gap. In some embodiments, the device further includes an inner spacer between the gate structure and the second source/drain feature, where the inner spacer directly interfaces with the isolation feature. Moreover, the inner spacer is spaced away from the first source/drain feature. In some embodiments, a top surface of the isolation feature extends below a bottom surface of a bottommost layer of the stack of semiconductor layers.

In an exemplary aspect, the present disclosure is directed to a semiconductor device. The semiconductor device includes base fin structures on a semiconductor substrate, stacks of channel layers each above a respective base fin structure of the base fin structures along a first direction. The first direction is perpendicular to a top surface of the semiconductor substrate. The semiconductor device also includes first source/drain features between adjacent base fin structures, and second source/drain features between adjacent stacks of channel layers. Moreover, the second source/drain features are each above a respective first source/drain feature of the first source/drain features along the first direction. Furthermore, the first source/drain features and the second source/drain features have opposite conductivity types.

In some embodiments, the semiconductor device further includes an isolation feature between each of second source/drain features and the respective first source/drain feature. In some embodiments, the semiconductor device further includes an inner spacer interfacing with the isolation feature. The inner spacer has a sidewall surface partially interfacing with a second source/drain feature of the source/drain features and partially interfaces with the isolation feature. In some embodiments, the semiconductor device further includes an air gap between each of second source/drain features and the respective first source/drain feature. In some embodiments, the semiconductor device further includes gate structures, where the gate structures each have a top portion engaging with a respective stack of the stacks of channel layers and a bottom portion engaging with a respective base fin structure of the base fin structures. In some embodiments, the inner spacers are each spaced away from the first source/drain features. In some embodiments, a bottommost inner spacer of the inner spacers has a sidewall surface exposed in an air gap, where the air gap extends between a respective pair of first source/drain feature and second source/drain feature.

In an exemplary aspect, the present disclosure is directed to a method. The method includes receiving a semiconductor substrate, and forming a stack of first semiconductor layers and second semiconductor layers vertically arranged in an interleaving manner over the semiconductor substrate. The first semiconductor layers and the second semiconductor layers have different material compositions. The method also includes forming a gate structure over the stack and recessing portions of the stack on both sides of the gate structure to form source/drain trenches. The source/drain trenches each have a respective bottom portion below a bottom surface of stack. The method further includes forming inner spacers in the gaps between end portions of vertically adjacent second semiconductor layers, forming first source/drain features in the bottom portions of the source/drain trenches, forming isolation features on top of and covering the first source/drain features, and forming second source/drain features on the isolation features.

In some embodiments, the method further includes forming an interlayer dielectric (ILD) over the second source/drain features, replacing a dummy gate stack of the gate structure with a functional gate stack, forming a first silicide layer on the first source/drain features and first contacts on the first silicide layer, and forming a second silicide layer on the exposed backside of the second source/drain features and second contacts on the second silicide layer. In some embodiments, the forming of the first source/drain features includes forming with a first dopant, and the forming of the second source/drain features includes forming with a second dopant. Moreover, the first dopant and the second dopant have opposite conductivity types. In some embodiments, the forming of the second source/drain features includes forming the second source/drain features at least partially spaced away from the isolation features. In some embodiments, the recessing exposes sidewall surfaces for the second semiconductor layers. Moreover, the forming of the first source/drain features includes a plurality of depositions and a plurality of etching operations. The plurality of the etching operations are configured to remove any material on the sidewall surfaces of the second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a semiconductor base fin;
   a fin-shaped structure disposed over the semiconductor base fin and extending lengthwise along a first direction, the fin-shaped structure including a stack of semiconductor layers arranged one over another along a second direction perpendicular to the first direction;
   a first source/drain feature of a first dopant type on the fin-shaped structure and spaced away from the stack of semiconductor layers;
   a second source/drain feature of a second dopant type on the fin-shaped structure over the first source/drain feature along the second direction and connected to the stack of semiconductor layers, wherein the second dopant type is different from the first dopant type; and
   an isolation feature interposing between the first source/drain feature and the second source/drain features,
   wherein the isolation feature extends along and is in contact with a sidewall of the semiconductor base fin.

2. The device of claim 1, further comprising a first contact connected to the first source/drain feature on a first side of the fin-shaped structure along the second direction and a second contact connected to the second source/drain features on a second side of the fin-shaped structure along the second direction, the second side being opposite to the first side.

3. The device of claim 1, further comprising:
   a gate structure on the semiconductor base fin and on and between the stack of semiconductor layers, the gate structure extending lengthwise along a third direction perpendicular to the first direction and perpendicular to the second direction.

4. The device of claim 1, wherein the isolation feature interfaces with the first source/drain feature on a first feature surface and interfaces with the second source/drain feature on a second feature surface, and
   wherein the first feature surface is spaced away from the second feature surface.

5. The device of claim 1, wherein a bottom surface of the second source/drain feature and a top surface of the isolation feature define an air gap.

6. The device of claim 5, further comprising an inner spacer between the gate structure and the second source/drain feature,
   wherein a sidewall surface of the inner spacer is partially exposed in the air gap.

7. The device of claim 3, further comprising an inner spacer between the gate structure and the second source/drain feature,
   Wherein a sidewall of the inner spacer directly interfaces with the isolation feature, and
   wherein the inner spacer is spaced away from the first source/drain feature.

8. The device of claim 1, wherein a top surface of the isolation feature extends below a bottom surface of a bottommost layer of the stack of semiconductor layers.

9. A semiconductor device, comprising:
   base fin structures on a semiconductor substrate;
   stacks of channel layers each above a respective base fin structure of the base fin structures along a first direction perpendicular to a top surface of the semiconductor substrate;
   first source/drain features between adjacent base fin structures; and
   second source/drain features between adjacent stacks of channel layers and each above a respective first source/drain feature of the first source/drain features along the first direction,
   wherein the first source/drain features and the second source/drain features have opposite conductivity types,
   wherein top surfaces of the base fin structures are higher than top surfaces of the first source/drain features.

10. The semiconductor device of claim 9, further comprising an isolation feature between each of second source/drain features and the respective first source/drain feature.

11. The semiconductor device of claim 10, further comprising an inner spacer interfacing with the isolation feature, the inner spacer having a sidewall surface partially interfacing with a second source/drain feature and partially interfacing with the isolation feature.

12. The semiconductor device of claim 9, further comprising an air gap between each of second source/drain features and the respective first source/drain feature.

13. The semiconductor device of claim 9, further comprising gate structures, the gate structures each having a top portion engaging with a respective stack of the stacks of channel layers and a bottom portion engaging with a respective base fin structure of the base fin structures.

14. The semiconductor device of claim 9, further comprising inner spacers on sidewall surfaces of the second source/drain features, wherein the inner spacers are each spaced away from the first source/drain features.

15. The semiconductor device of claim 14, wherein a bottommost inner spacer of the inner spacers has a sidewall surface exposed in an air gap, the air gap extending between a respective pair of first source/drain feature and second source/drain feature.

16. A semiconductor structure, comprising:
a first source/drain feature having a first doping type;
an insulation layer on and in direct contact with a top surface of the first source/drain feature;
a base fin extending continuously along a sidewall of the first source/drain feature and a sidewall of the insulation layer;
a second source/drain feature having a second doping type different from the first doping type, wherein the second source/drain feature is physically isolated from the first source/drain feature by the insulation layer;
a first source/drain contact disposed under and electrically coupled to the first source/drain feature; and
a second source/drain contact disposed over and electrically coupled to the second source/drain feature.

17. The semiconductor structure of claim 16, wherein the first doping type comprises N type, and the second doping type comprises P type.

18. The semiconductor structure of claim 16, further comprising:
an air gap between the insulation layer and the second source/drain feature.

19. The semiconductor structure of claim 16, further comprising:
a plurality of nanostructures coupled to and in direct contact with the second source/drain feature; and
inner spacer features disposed between two adjacent nanostructures of the plurality of nanostructures.

20. The semiconductor structure of claim 19, wherein a top surface of the first source/drain feature is below a bottom surface of a bottommost nanostructure of the plurality of nanostructures, and a top surface of the insulation layer is above below the bottom surface of the bottommost nanostructure of the plurality of nanostructures.

* * * * *